(12) United States Patent
Zang et al.

(10) Patent No.: US 9,443,738 B2
(45) Date of Patent: Sep. 13, 2016

(54) INTEGRATED CIRCUITS WITH MIDDLE OF LINE CAPACITANCE REDUCTION IN SELF-ALIGNED CONTACT PROCESS FLOW AND FABRICATION METHODS

(71) Applicants: GLOBALFOUNDRIES Inc., Grand Cayman (KY); INTERNATIONAL BUSINESS MACHINES CORPORATION, Armonk, NY (US)

(72) Inventors: Hui Zang, Guilderland, NY (US); Balasubramanian Pranatharthiharan, Watervliet, NY (US)

(73) Assignees: GLOBALFOUNDRIES INC., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/616,226

(22) Filed: Feb. 6, 2015

(65) Prior Publication Data

US 2016/0233091 A1     Aug. 11, 2016

(51) Int. Cl.
   *H01L 29/78*    (2006.01)
   *H01L 21/283*   (2006.01)
   *H01L 21/28*    (2006.01)

(52) U.S. Cl.
   CPC ....... *H01L 21/283* (2013.01); *H01L 21/28008* (2013.01); *H01L 29/78* (2013.01)

(58) Field of Classification Search
   USPC ....................................................... 257/288
   See application file for complete search history.

(56) References Cited

U.S. PATENT DOCUMENTS

| | | | | |
|---|---|---|---|---|
| 7,923,337 B2* | 4/2011 | Chang | ............... | H01L 29/66545 257/346 |
| 8,445,345 B2* | 5/2013 | Cheng | ............. | H01L 21/823857 257/E21.444 |
| 8,859,378 B2* | 10/2014 | Liang | .............. | H01L 21/823431 257/E21.431 |
| 8,951,868 B1* | 2/2015 | Jain | ...................... | H01L 29/6681 438/183 |
| 2006/0081836 A1* | 4/2006 | Kimura | ........... | H01L 21/823412 257/19 |
| 2009/0001480 A1* | 1/2009 | Cheng | ............... | H01L 29/42368 257/387 |
| 2012/0193729 A1* | 8/2012 | Ando | ................ | H01L 21/26506 257/412 |
| 2013/0168741 A1* | 7/2013 | Fumitake | .......... | H01L 29/42316 257/256 |
| 2013/0320411 A1* | 12/2013 | Fan | ......................... | H01L 29/78 257/288 |
| 2014/0145246 A1* | 5/2014 | Ning | ..................... | H01L 29/812 257/280 |
| 2015/0091089 A1* | 4/2015 | Niebojewski | ....... | H01L 29/0843 257/347 |
| 2015/0318377 A1* | 11/2015 | Cheng | ............... | H01L 29/66537 257/349 |

* cited by examiner

*Primary Examiner* — Thao P Le
(74) *Attorney, Agent, or Firm* — Heslin Rothenberg Farley & Mesiti P.C.; Jacquelyn A Graff

(57) ABSTRACT

Semiconductor devices and methods for forming the devices with middle of line capacitance reduction in self-aligned contact process flow are provided. One method includes, for instance: obtaining a wafer with at least one source, at least one drain, and at least one sacrificial gate; forming a first contact region over the at least one source and a second contact region over the at least one drain; removing the at least one sacrificial gate; forming at least one gate; and forming at least one small contact over the first contact region and the second contact region. An intermediate semiconductor device is also disclosed.

13 Claims, 35 Drawing Sheets

INTEGRATED CIRCUITS WITH MIDDLE OF LINE CAPACITANCE REDUCTION IN SELF-ALIGNED CONTACT PROCESS FLOW AND FABRICATION METHODS

FIELD OF THE INVENTION

The present invention relates to semiconductor devices and methods of fabricating semiconductor devices, and more particularly, to integrated circuits with middle of line capacitance reduction in self-aligned contact process flow and fabrication methods before replacement metal gate.

BACKGROUND OF THE INVENTION

As semiconductor devices continue to decrease in size, FinFET parasitic gate to contact capacitance continues to increase due to the scaling of gate pitch. In addition, as FinFET devices continue to shrink, more gate to contact shorts are experienced. The gate to contact shorts are a major yield killer for smaller FinFET devices. Thus, a reduction in both gate to contact capacitance and a reduction in gate to contact short failure are needed.

SUMMARY OF THE INVENTION

The shortcomings of the prior art are overcome and additional advantages are provided through the provision, in one aspect, a method includes obtaining a wafer with at least one source, at least one drain, and at least one sacrificial gate; forming a first contact region over the at least one source and a second contact region over the at least one drain; removing the at least one sacrificial gate; forming at least one gate; and forming at least one first small contact over the first contact region and at least one second small contact over the second contact region.

In another aspect, a device is provided which includes, for instance: a wafer with at least one gate, at least one source region, and at least one drain region; at least one first base region adjacent to the at least one source region; at least one second base region adjacent to the at least one drain region; at least one first contact region positioned over the at least on first base region and at least a portion of the at least one source region; at least one second contact region positioned over the at least one second base region and at least a portion of the at least one drain region; and at least two small contacts, wherein at least one small contact is positioned on the at least one first contact region and at least one small contact is positioned on the at least one second contact region.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain semiconductor devices, for example, field-effect transistors (FETs), which provide advantages over the above noted, existing semiconductor devices and fabrication processes. Advantageously, the semiconductor device fabrication processes disclosed herein provide for devices with a reduction in both gate to contact capacitance and a reduction in gate to contact short failure.

Figure 1:
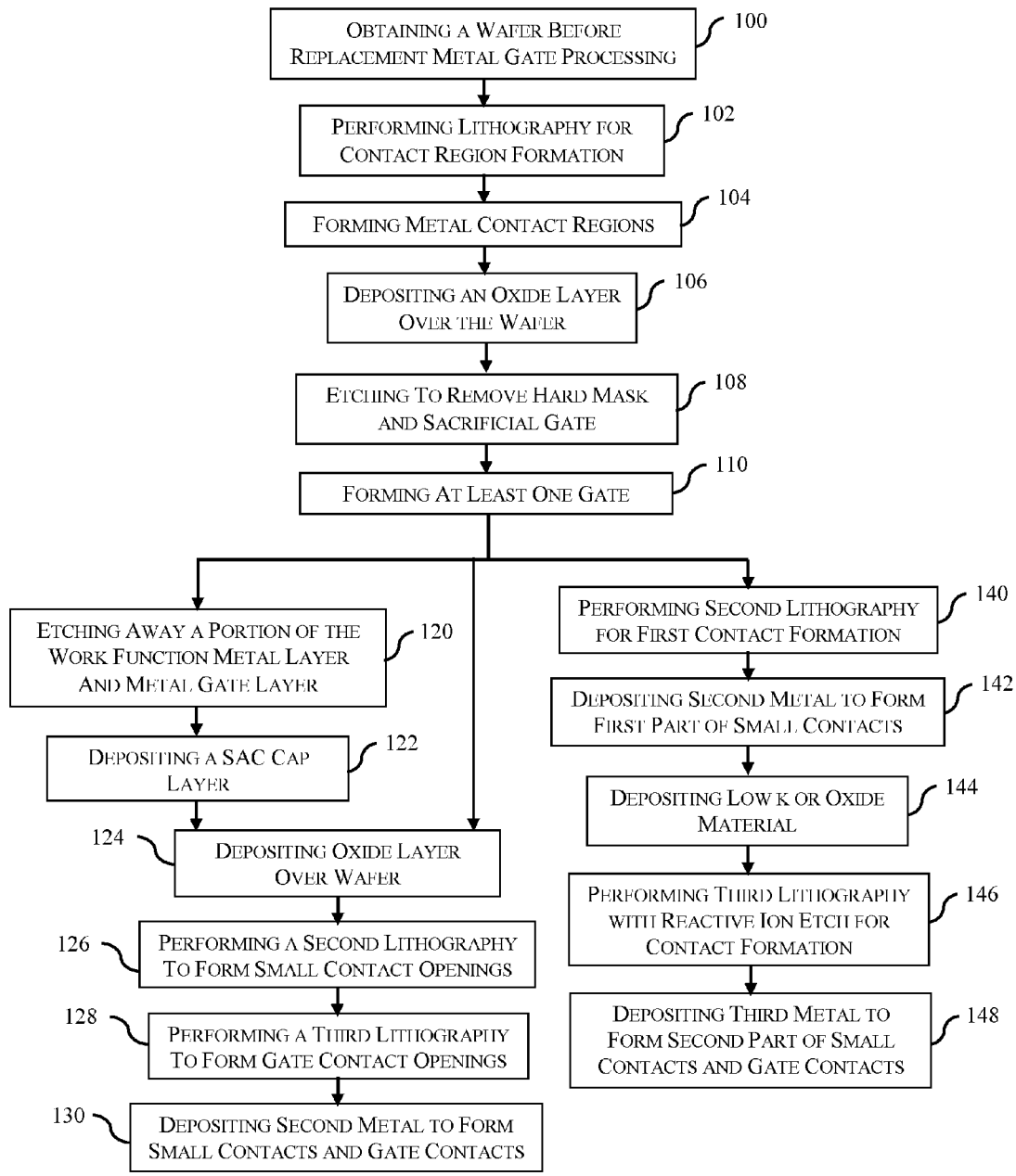
FIG. 1 depicts one embodiment of methods for forming an integrated circuit with self-aligned contacts before replacement metal gate, in accordance with one or more aspects of the present invention.

In one aspect, in one embodiment, as shown in FIG. 1, semiconductor device formation process in accordance with one or more aspects of the present invention may include, for instance: obtaining a wafer before replacement metal gate (RMG) processing 100; performing lithography for contact region formation 102; forming metal contact regions 104; depositing an oxide layer over the wafer 106; etching to remove the hard mask and sacrificial gate 108, and forming at least one gate 110. In one embodiment, after forming the at least one gate 110, the process may also include, for instance: etching away a portion of the work function metal layer and metal gate layer 120; depositing a self aligned contact (SAC) cap layer 122; depositing an oxide layer over the wafer 124; performing a second lithography for contact formation 126; depositing a second metal to form small contacts 128; performing a third lithography for gate formation 130; and depositing a third metal to form gate contacts 132.

In another embodiment, after forming the at least one gate 110, the process may include, for instance: depositing an oxide layer over the wafer 124; performing a second lithography to form small contact openings 126; performing a third lithography to form gate contact openings 128; and depositing a second metal to form the small contacts and gate contacts 130.

In yet another embodiment, after forming the at least one gate 110, the process may include, for instance: performing a second lithography to form a first part of the small contacts 140; depositing a second metal to form the first part of the small contacts 142; depositing a low k or oxide material over the device 144; performing a third lithography with reactive ion etch to form a second part of the small contacts and the gate contacts 146; and depositing a third metal to form the second part of the small contacts and the gate contacts 148.

FIGS. 2-43 depict, by way of example only, several detailed embodiments of a portion of the FinFET device formation process of FIG. 1 and a portion of an intermediate FinFET structure, in accordance with one or more aspects of the present invention. Note again that these figures are not drawn to scale in order to facilitate understanding of the invention, and that the same reference numerals used throughout different figures designate the same or similar elements.

Figure 2:
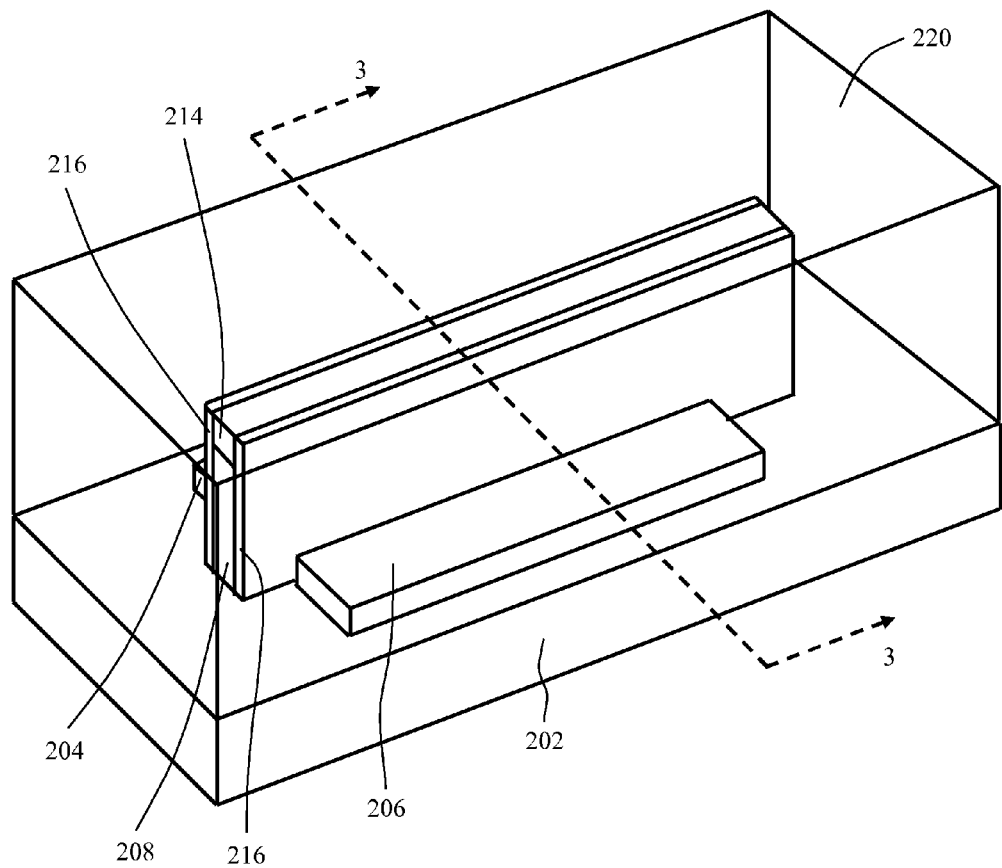
FIG. 2 depicts a perspective view of a portion of a semiconductor device with at least one sacrificial gate, a source, and a drain, in accordance with one or more aspects of the present invention.

One detailed embodiment of a portion of the FinFET device formation process of FIG. 1 is depicted, by way of example only, in FIGS. 2-25. FIG. 2 shows a portion of a semiconductor device 200 obtained during the fabrication process before replacement metal gate processing. The device 200 may have been processed through initial device processing steps in accordance with the design of the device 200 being fabricated, for example, the device 200 may include, for example, an isolation region 202, at least one source region 204, at least one drain region 206, and at least one sacrificial gate 208. It is also contemplated that additional features may be present on the device 200. The at least one source region 204, at least one drain region 206, and at least one sacrificial gate 208 are shown positioned over the isolation region 202 for ease of illustration. The at least one source region 204 and at least one drain region 206 may be, for example, embedded silicon germanium (eSiGe) for pFETs or embedded silicon phosphorus (eSiP) for nFETs. The at least one sacrificial gate 208 may be positioned over one or more fins (not shown). A silicon dioxide ($SiO_2$) layer (not shown) may be positioned between the at least one sacrificial gate 208 and the isolation region 202. At least one hard mask 214 may be positioned over the at least one sacrificial gate 208. The at least one sacrificial gate 208 may be surrounded by spacers 216 positioned on each side of the at least one sacrificial gate 208 and hard mask 214. The at least one source region 204 and at least one drain region 206 may be, for example, positioned offset from the at least one sacrificial gate 208. As shown, the at least one source region 204 and at least one drain region 206 may be positioned, such that the at least one source region 204 and at least one drain region 206 only overlap the at least one sacrificial gate 208 along a portion of the at least one sacrificial gate 208. The positioning of the source region 204 and drain region 206 offset from the sacrificial gate 208 reduces the overlap between contacts formed on the source and drain regions 204, 206 and the sacrificial gate 208. However, it is also contemplated that the source region 204 and drain region 206 may be positioned adjacent to the sacrificial gate 208.

Figure 3:
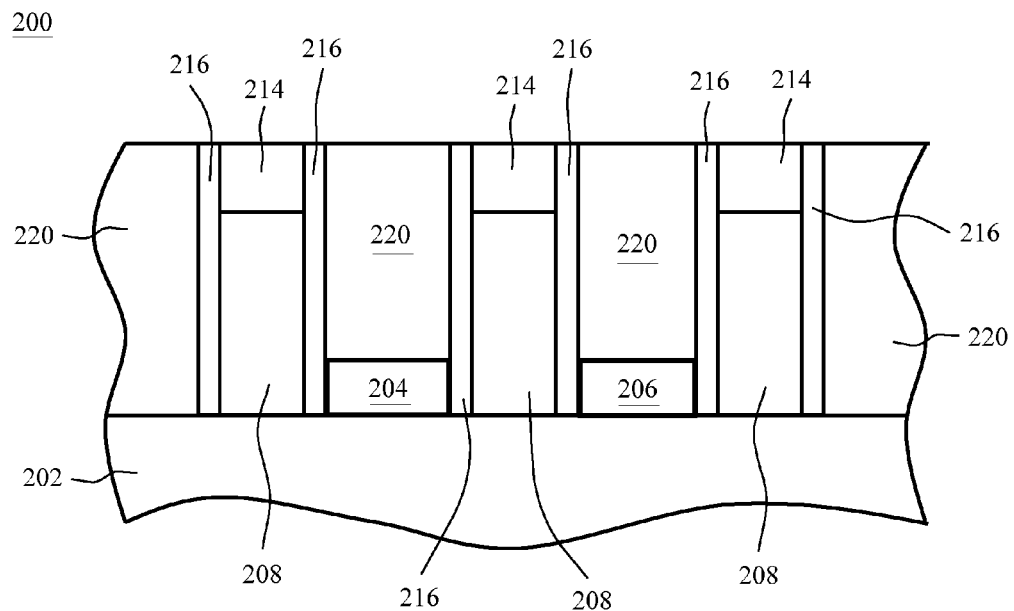
FIG. 3 depicts a cross-sectional elevation view of the semiconductor device of FIG. 2 taken along line 3-3, after depositing and planarizing an oxide layer, in accordance with one or more aspects of the present invention.
Figure 4:
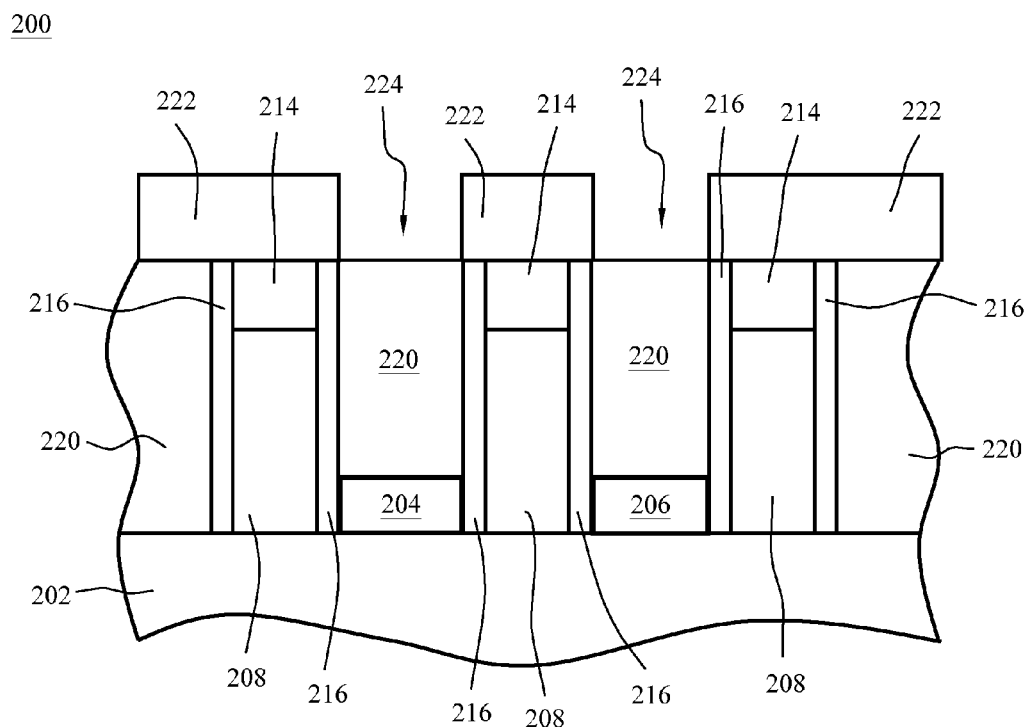
FIG. 4 depicts the structure of FIG. 3 after applying and patterning a photo resist layer, in accordance with one or more aspects of the present invention.
Figure 5:
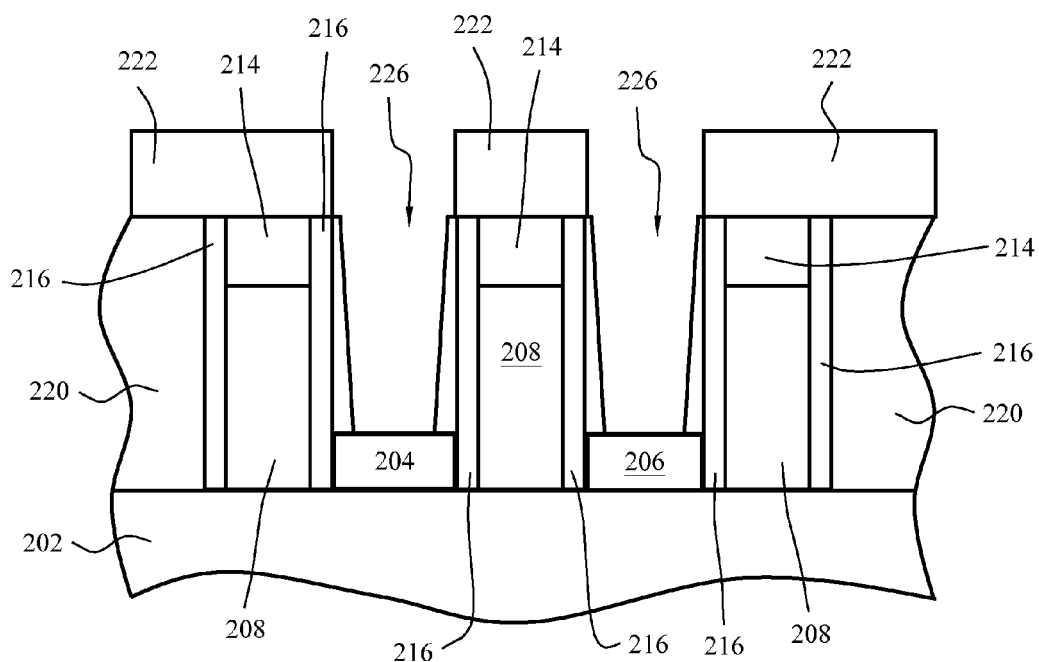
FIG. 5 depicts the structure of FIG. 4 after etching the oxide layer, in accordance with one or more aspects of the present invention.

As shown in FIGS. 2 and 3, the device 200 may also include an oxide layer 220 deposited over the device 200 and planarized leaving the oxide layer 220 surrounding or positioned between the at least one sacrificial gate 208. The oxide layer 220 may be planarized down to the top of the hard masks 214 by, for example, chemical mechanical planarization (CMP). The at least one sacrificial gate 208 may be spaced apart from the oxide layer 220 by the spacers 216. As depicted in FIG. 4, a photo resist layer 222 may be deposited over the device 200. Then lithography may be performed to pattern openings 224 in the photo resist layer 222. Next, as shown in FIG. 5, the device 200 may be etched to remove the portion of the oxide layer 220 not covered by the photo resist layer 222 forming cavities 226 between the sacrificial gates 208. The etching of the oxide layer 220 may be, for example, a dry etch or a wet etch. The device 200 may be etched down to the top of the at least one source region 204 and at least one drain region 206. The cavities 226 may be positioned over the at least one source region 204 and at least one drain region 206 and a portion of the oxide layer, shown as regions 218 in FIG. 10.

It is also contemplated that two etches may be performed, when forming the cavities 226. The first etch may be performed to form regions 218 that extend out from the at least one source region 204 and at least one drain region 206 past the at least one gate 208 which may be filled with a first metal material. Then, after a partial recess etch is performed down to the top of the at least one source region 204 and at least one drain region 206 to form regions 218, a second etch may be performed to form the cavities 226 over the regions 218 and the at least one source region 204 and at least one drain region 206.

Figure 6:
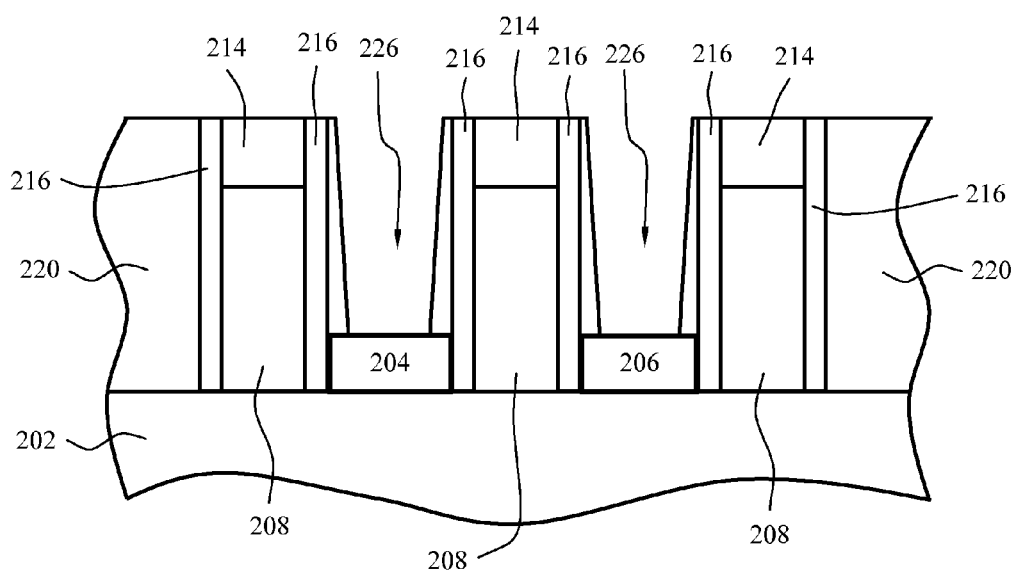
FIG. 6 depicts the structure of FIG. 5 after removing the photo resist layer, in accordance with one or more aspects of the present invention.
Figure 7:
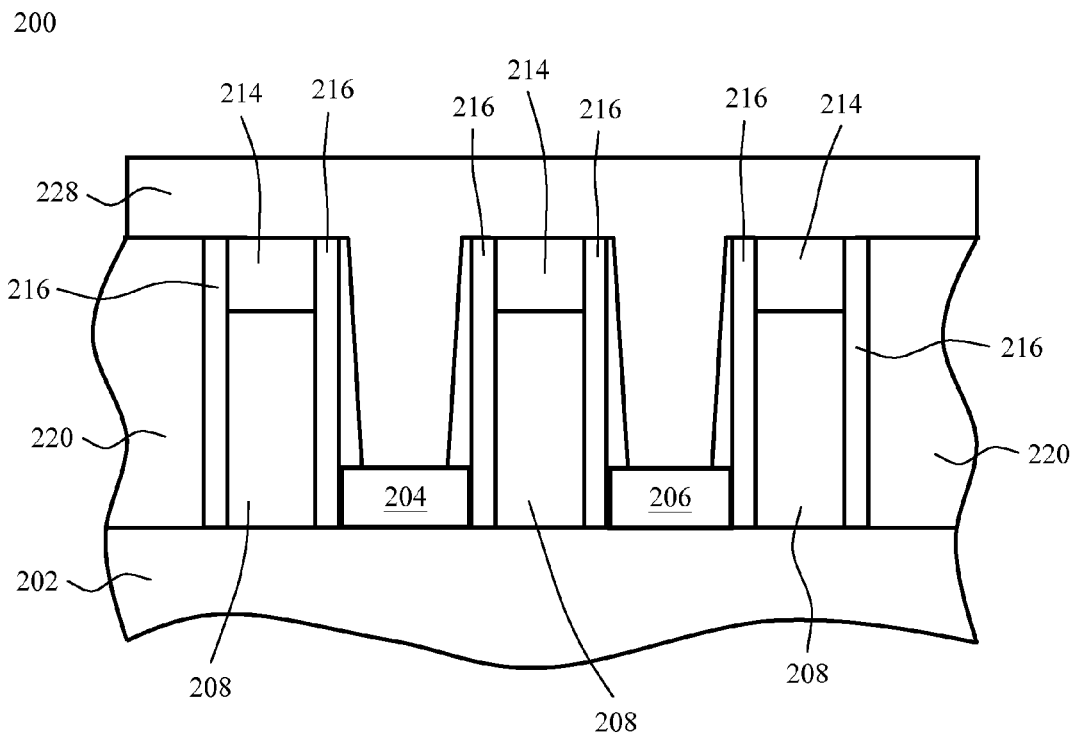
FIG. 7 depicts the structure of FIG. 6 after depositing at least one metal layer, in accordance with one or more aspects of the present invention.
Figure 8:
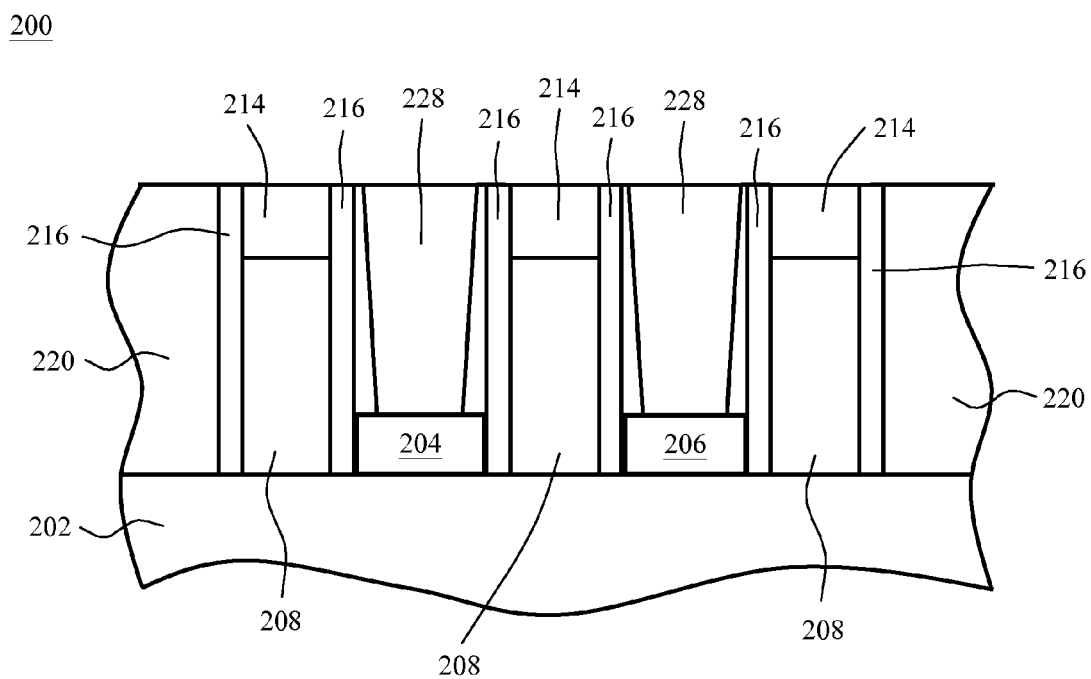
FIG. 8 depicts the structure of FIG. 7 after performing planarization on the device, in accordance with one or more aspects of the present invention.
Figure 9:
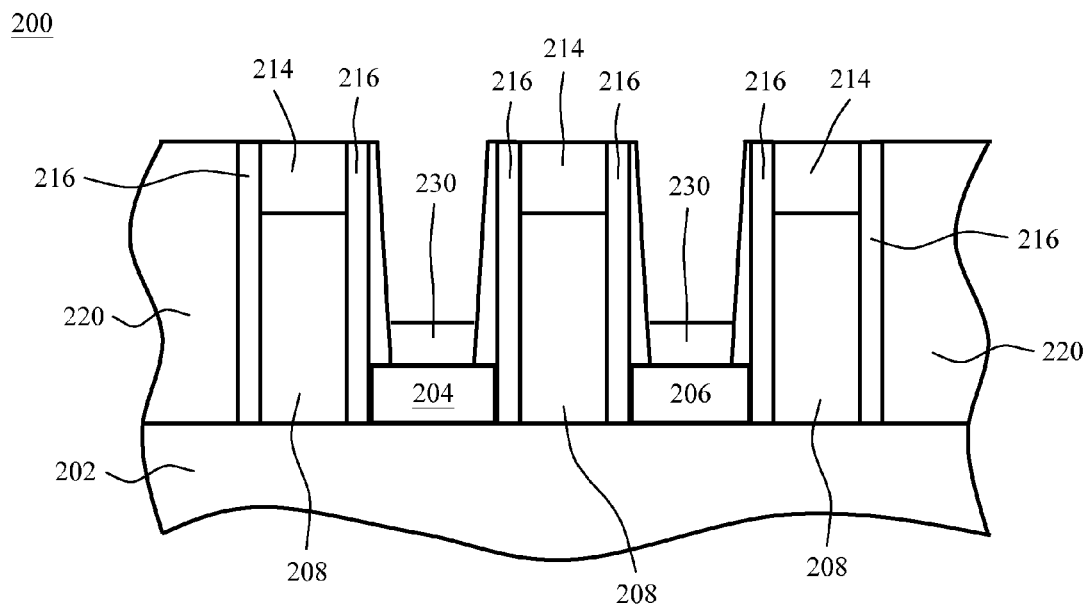
FIG. 9 depicts the structure of FIG. 8 after etching into the metal layer to form a contact region, in accordance with one or more aspects of the present invention.
Figure 10:
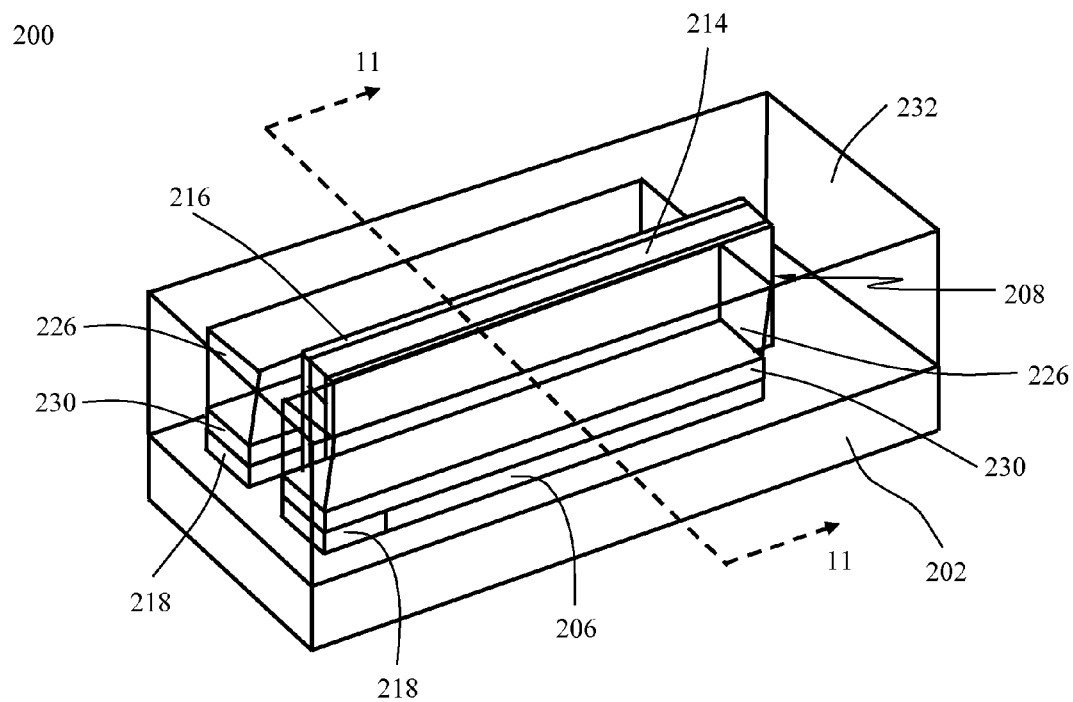
FIG. 10 depicts a perspective view of the structure of FIG. 9, in accordance with one or more aspects of the present invention.
Figure 11:
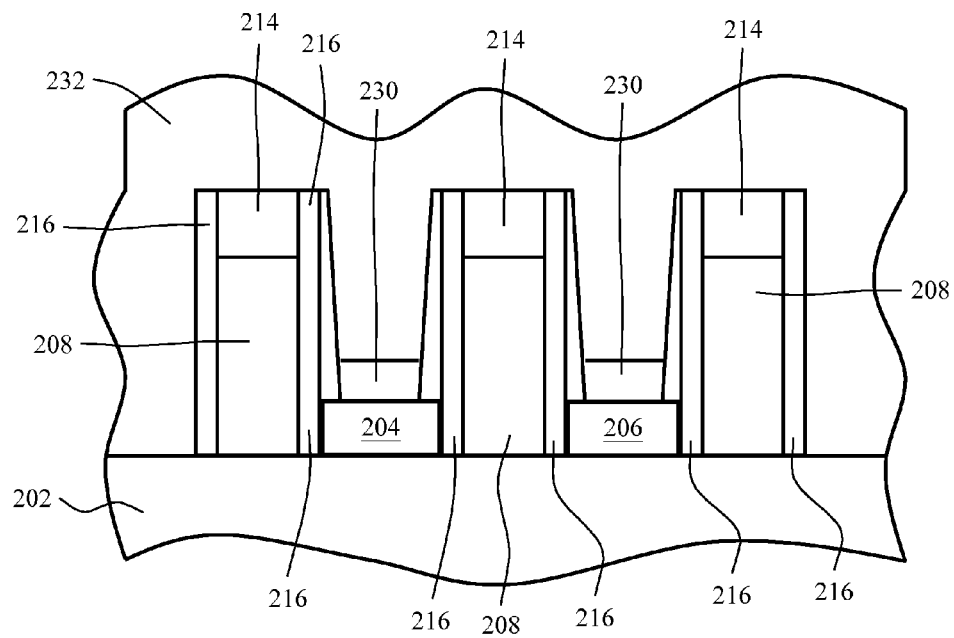
FIG. 11 depicts the structure of FIG. 9 after depositing a second oxide layer on the device, in accordance with one or more aspects of the present invention.
Figure 12:
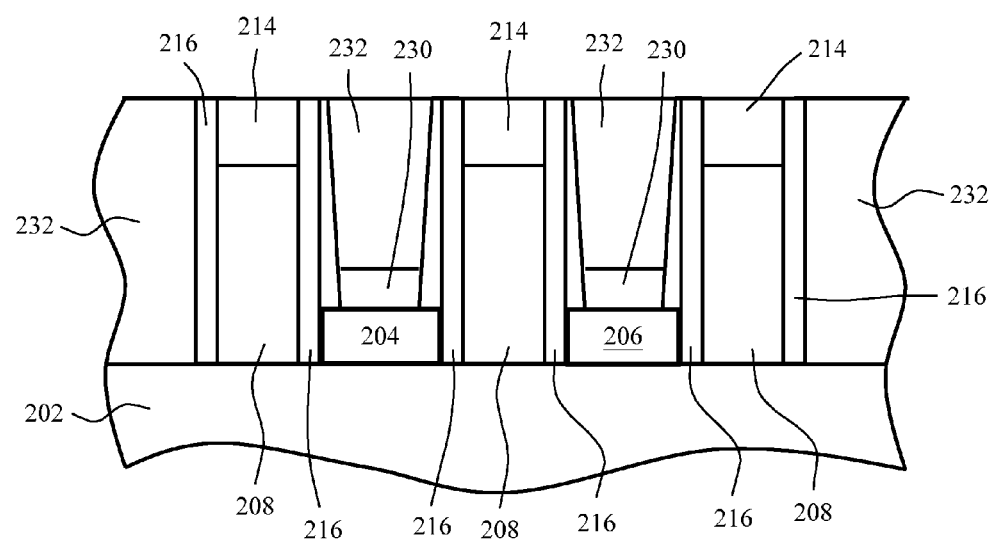
FIG. 12 depicts the structure of FIG. 11 after performing planarization, in accordance with one or more aspects of the present invention.

After the device 200 is etched the photo resist layer 222 may be removed, as shown in FIG. 6. A metal layer 228 may then be deposited over the device 200 to fill the cavities 226, as shown in FIG. 7. The metal layer 228 may be the same or a different metal than the first metal material that may be used to fill regions 218, if the device 200 design includes filling regions 218 with a metal. Then, the device 200 may be planarized by, for example, chemical mechanical planarization, as shown in FIG. 8. The planarization may be, for example, down to the top of the hard mask 214. Next, as shown in FIGS. 9 and 10, the metal layer 228 may be etched to form contact regions 230 positioned over the at least one source region 204 and at least one drain region 206. As shown in FIG. 11, a second oxide layer 232 may then be deposited over the device 200. The device 200 may then be planarized by, for example, chemical mechanical planarization, down to the top of the at least one hard mask 214, as shown in FIG. 12. After the device 200 is planarized the second oxide layer 232 will be positioned between the sacrificial gates 208.

Figure 13:
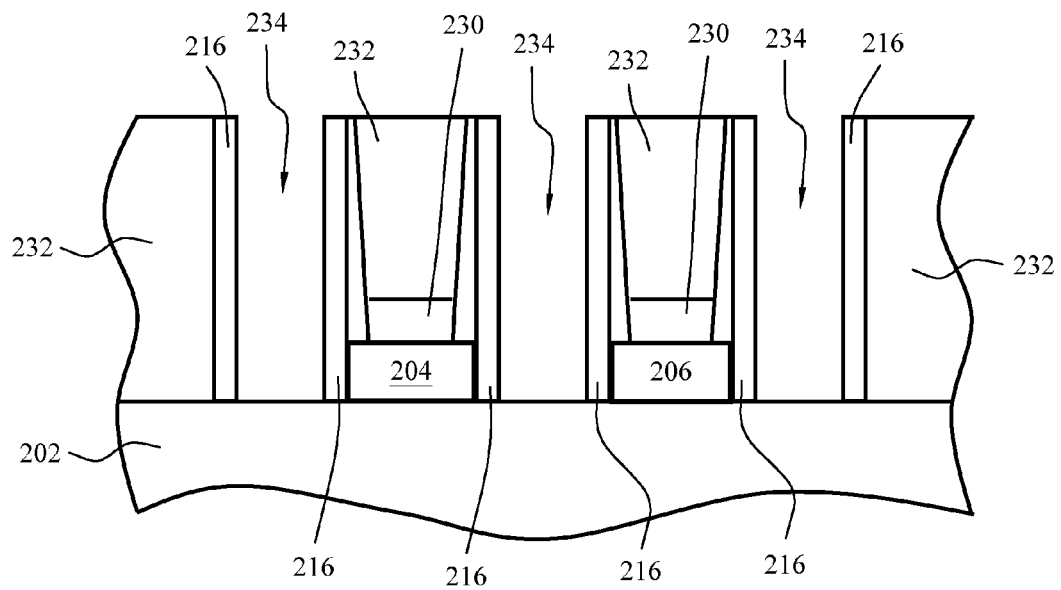
FIG. 13 depicts the structure of FIG. 12 after removing the hard masks and sacrificial gates, in accordance with one or more aspects of the present invention.
Figure 14:
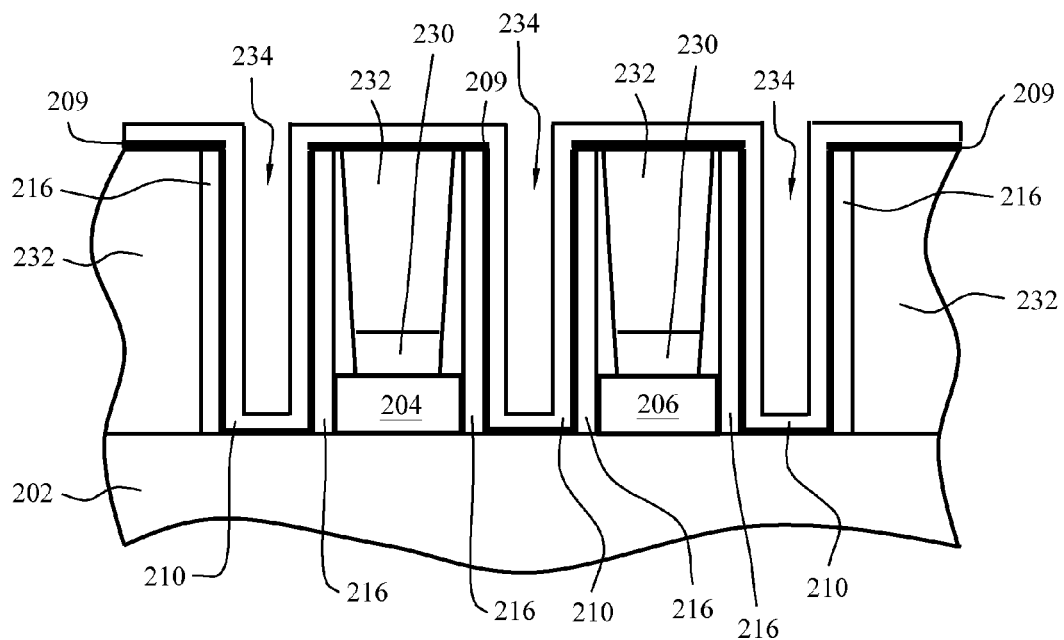
FIG. 14 depicts the structure of FIG. 13 after depositing a high-k layer and a work function metal layer, in accordance with one or more aspects of the present invention.
Figure 15:
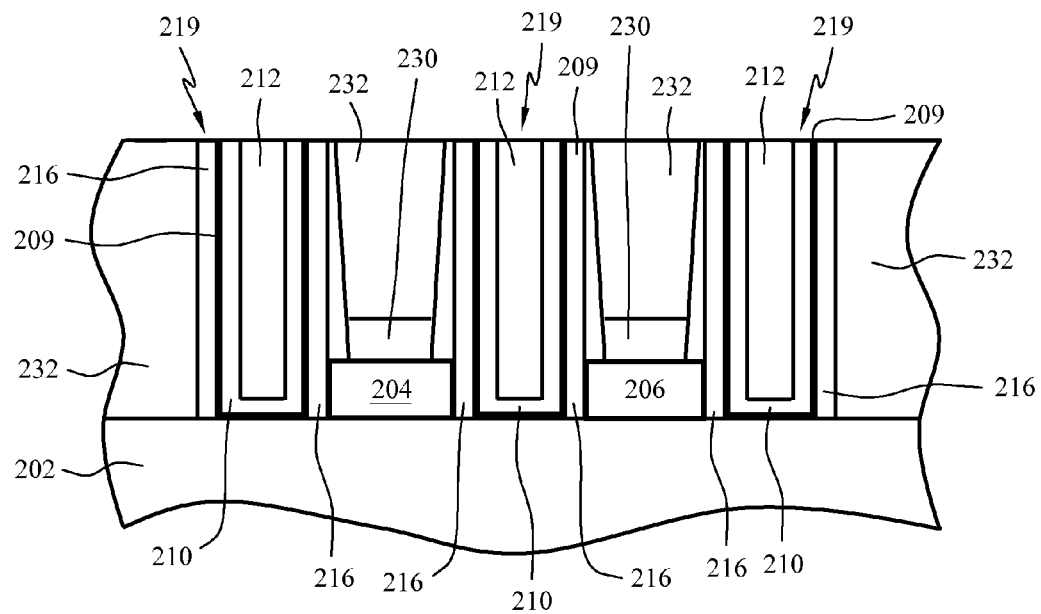
FIG. 15 depicts the structure of FIG. 14 after depositing a gate metal layer and performing planarization on the device, in accordance with one or more aspects of the present invention.
Figure 16:
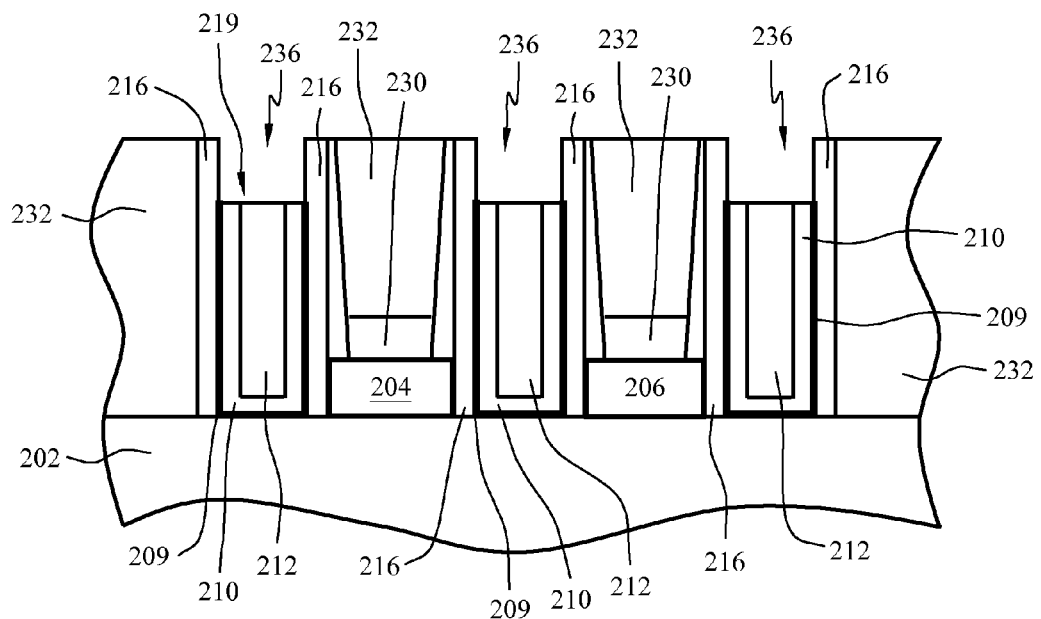
FIG. 16 depicts the structure of FIG. 15 after etching into the work function metal layer and gate metal, in accordance with one or more aspects of the present invention.

Next, as shown in FIG. 13, the hard mask 214 and sacrificial gate 208 may be removed by, for example, a poly pull processing to form openings 234. When the hard masks 214 and sacrificial gates 208 are removed the $SiO_2$ layer below the sacrificial gates 208 is also removed. Then, as shown in FIG. 14, a high k dielectric layer 209 may be deposited over the device 200 and into the openings 234. At least one work function metal 210 may be deposited over the high k dielectric layer 209, as shown in FIG. 14. A gate metal 212 may then be deposited over the device 200 and into the openings 234 between the at least one work function metal 210 and the device 200 may then be planarized to remove the excess gate metal 212, work function metal 210, and high k dielectric layer 209, as shown in FIG. 15. The dielectric layer 209, at least one work function metal 210, and gate metal 212 form at least one gate 219. As shown in FIG. 16, a portion of the at least one gate 219 between the spacers 216 may be etched into to form a cavity 236 over each gate 219.

Figure 17:
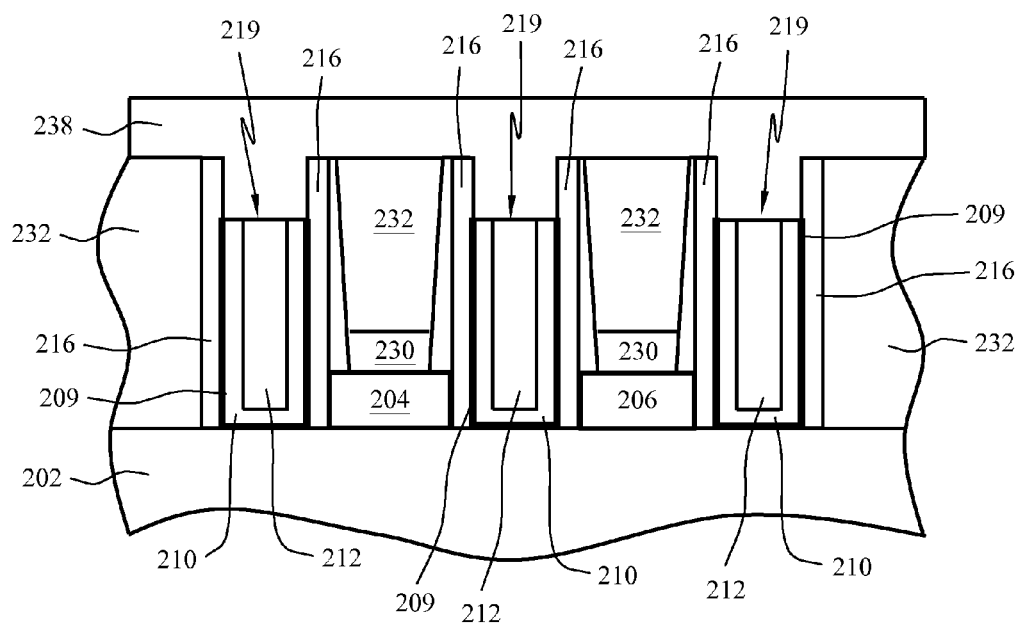
FIG. 17 depicts the structure of FIG. 16 after depositing an SAC cap material, in accordance with one or more aspects of the present invention.
Figure 18:
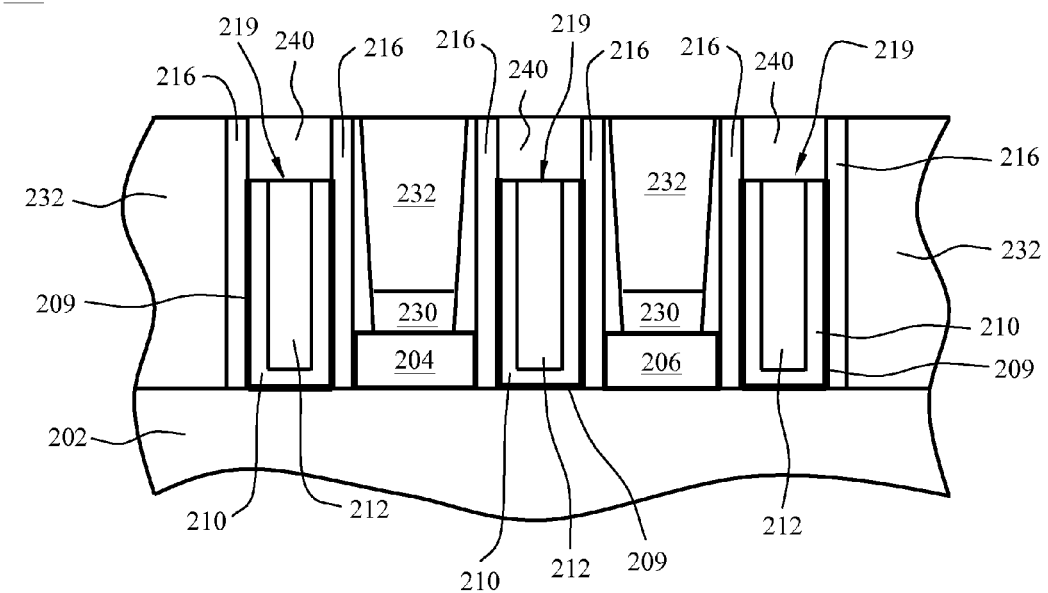
FIG. 18 depicts the structure of FIG. 17 after performing planarization to form at least one SAC cap, in accordance with one or more aspects of the present invention.
Figure 19:
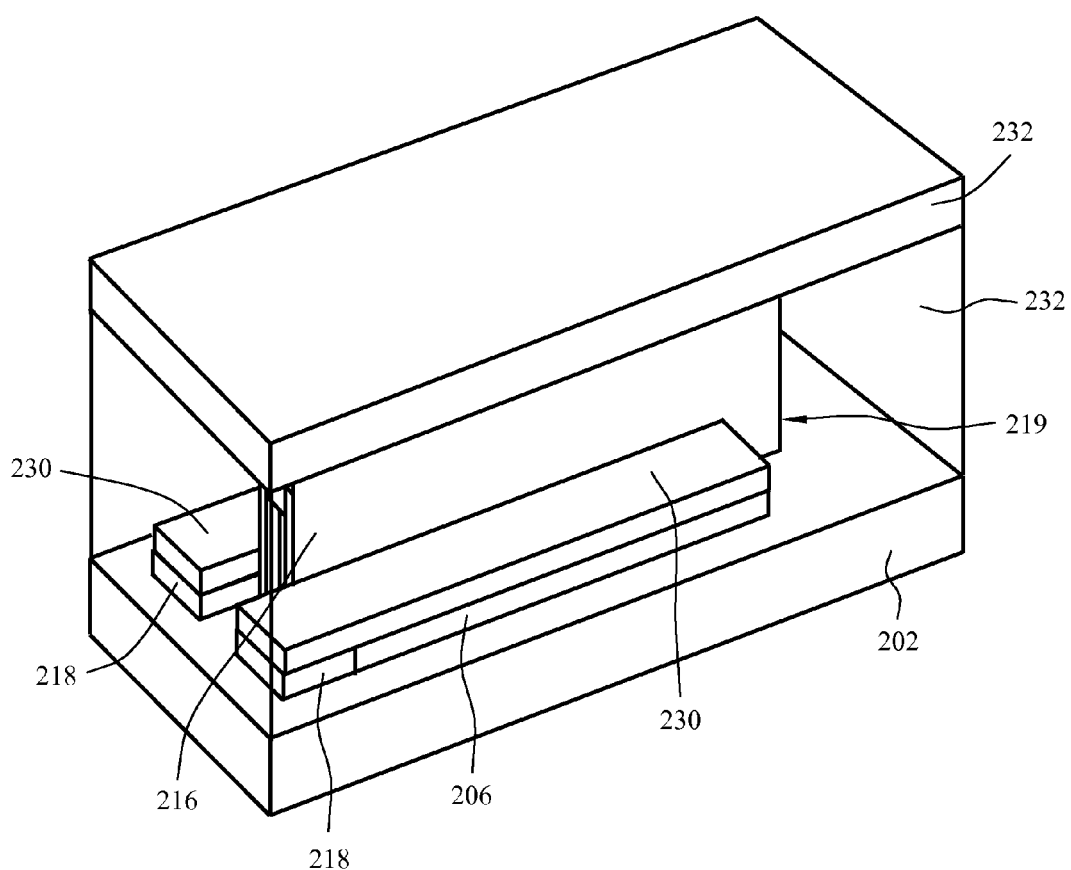
FIG. 19 depicts a perspective view of the structure of FIG. 18 after applying another oxide layer, in accordance with one or more aspects of the present invention.
Figure 20:
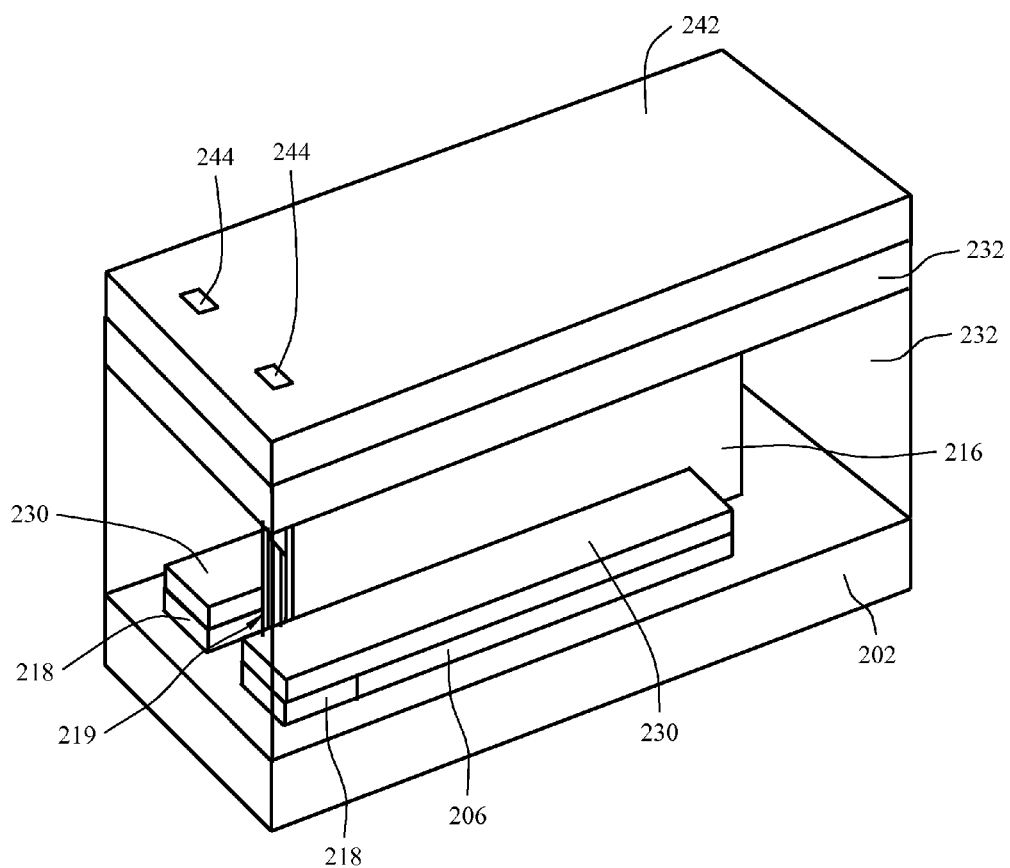
FIG. 20 depicts the structure of FIG. 19 after depositing and patterning the photo resist layer, in accordance with one or more aspects of the present invention.
Figure 21:
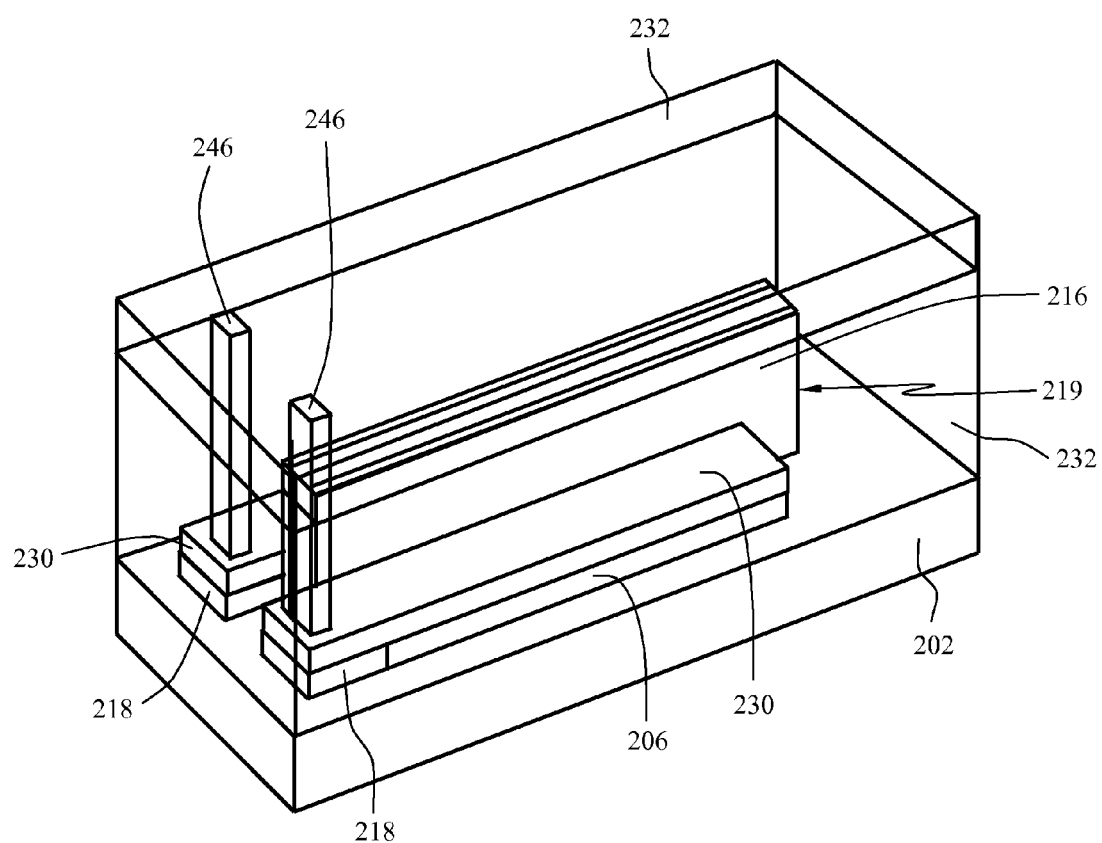
FIG. 21 depicts the structure of FIG. 20 after etching to pattern the small contact openings and removing the photo resist layer, in accordance with one or more aspects of the present invention.

Next, as shown in FIG. 17, a SAC cap material 238 may be deposited over the device 200. The SAC cap material 238 may be, for example, a nitride material, such as, silicon nitride (SiN), or another insulating material. Planarization, for example, chemical mechanical planarization, may be performed to the device to remove the excess SAC cap material 238 down to the height of the gate 219 to form SAC caps 240, as shown in FIG. 18. The terms "SAC cap" and "self-aligned contact cap" may be used interchangeably herein to refer to the protective material over the gates 219. Then, additional oxide 232 may be applied over the device 200, as shown in FIG. 19. The device 200 may be planarized after the additional oxide 232 is deposited. A photo resist layer 242 may then be applied and lithography may be performed to pattern the photo resist layer 242 to form openings 244, as illustrated in FIG. 20. Next, as shown in FIG. 21, the device 200 may be etched to pattern the small contact openings 246 in the oxide layer 232 and the photo resist layer 242 may be removed.

Figure 22:
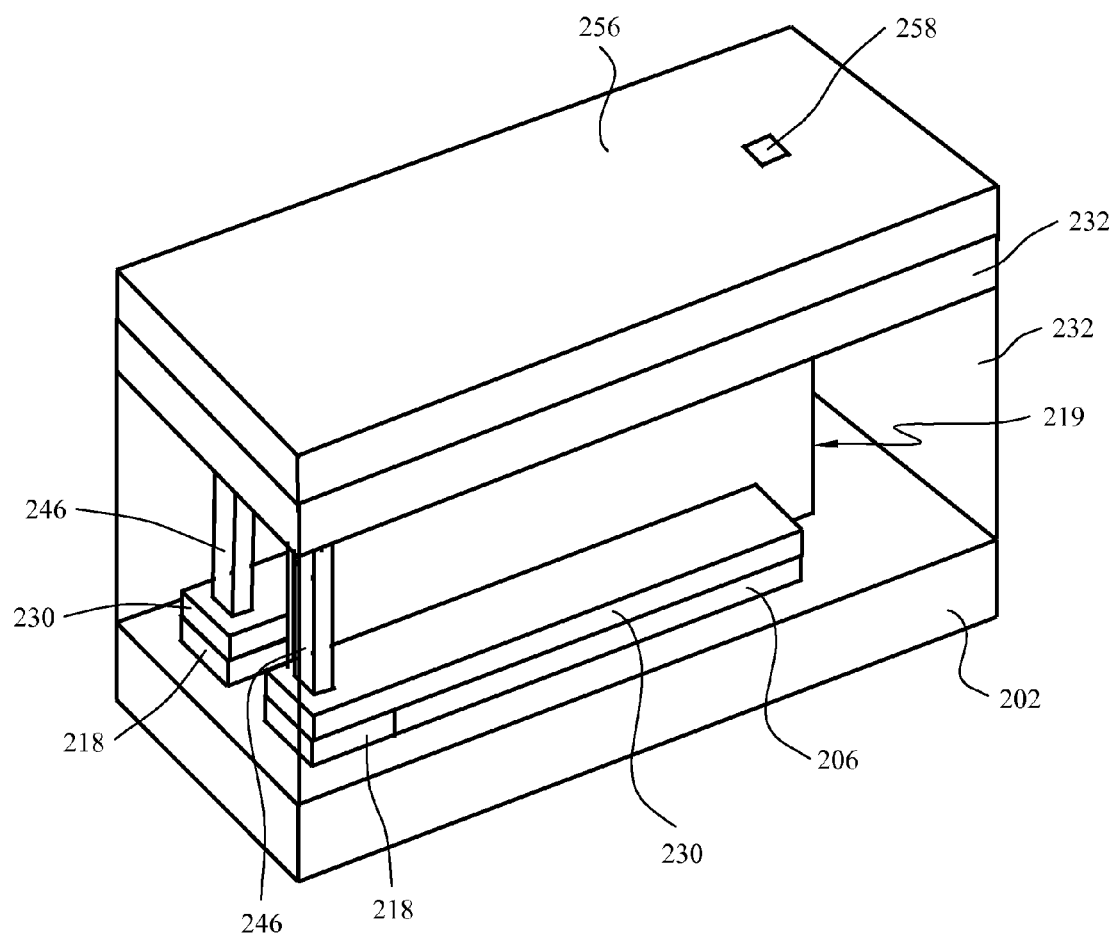
FIG. 22 depicts the structure of FIG. 21 after depositing additional oxide on the oxide layer and another photo resist layer on the device and patterning the gate contact openings, in accordance with one or more aspects of the present invention.
Figure 23:
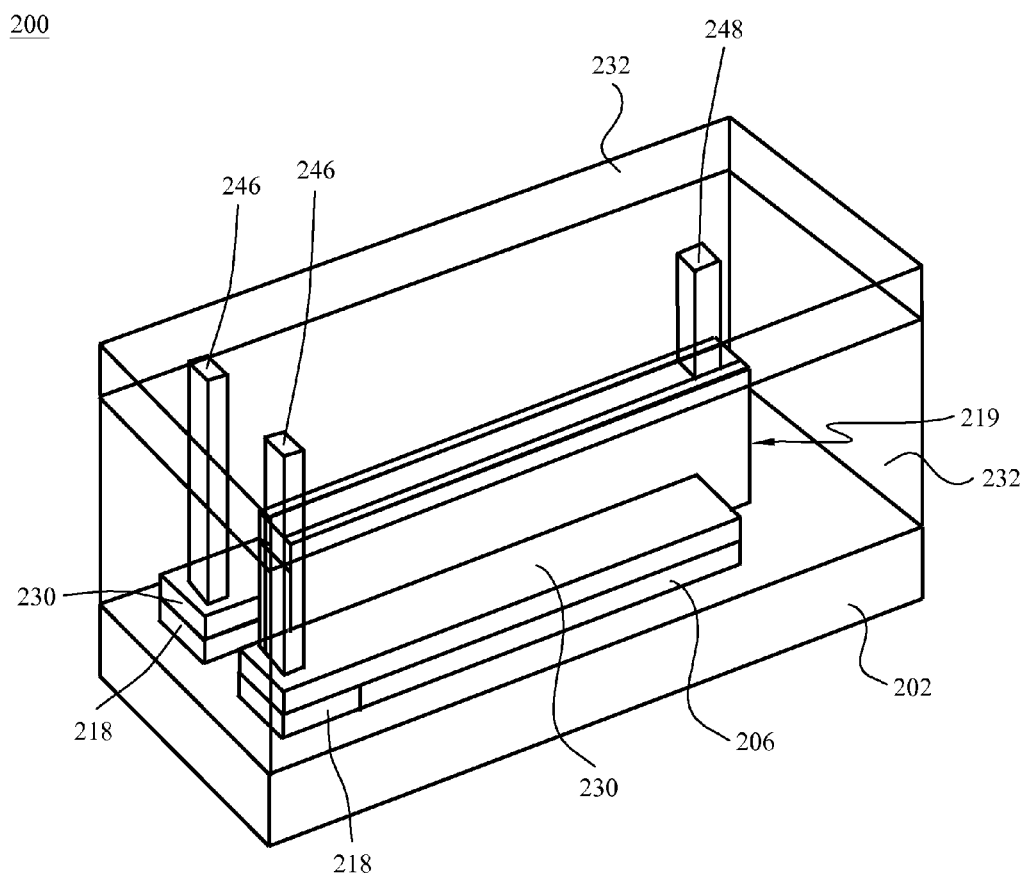
FIG. 23 depicts the structure of FIG. 22 after etching to open the gate contact openings and removing the photo resist layer, in accordance with one or more aspects of the present invention.
Figure 24:
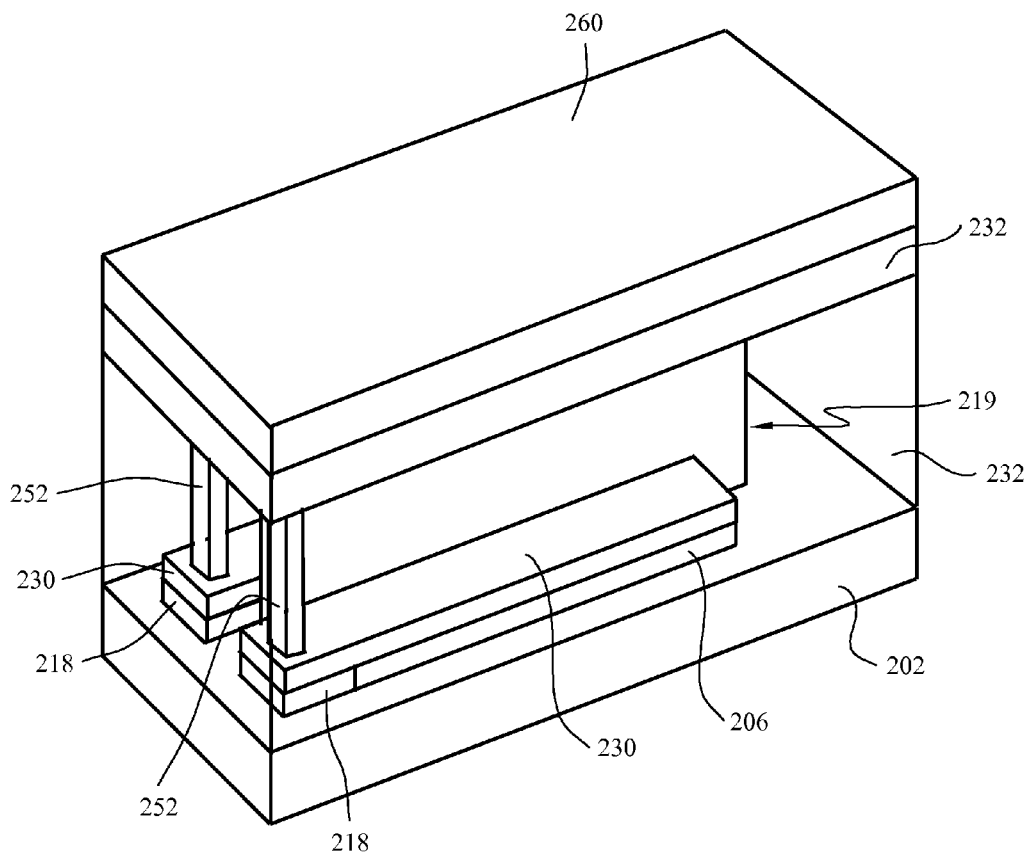
FIG. 24 depicts the structure of FIG. 23 after depositing a metal layer to form the small contacts and gate contacts, in accordance with one or more aspects of the present invention.

Once the small contact openings 246 are formed, another photo resist layer 256 may be applied over the device 200 and lithography may be performed to pattern the photo resist layer 256 for forming gate openings 258, as illustrated in FIG. 22. The photo resist layer 256 may be, for example, a multilayer photo resist layer, such as, a three layer photo resist layer 256 including an organic planarizing layer (OPL). The OPL may, for example, fill the small contact openings 246 during lithography of the gate contact openings 258. Next, as shown in FIG. 23, the device 200 may be etched to form the gate contact openings 248 in the oxide layer 232 and the photo resist layer 256 may be removed from over the device 200 and from within the small contact openings 246. After the gate contact openings 248 are formed, a metal layer 260 may be deposited over the device 200 to fill the openings 246, 248, as shown in FIG. 24. The device 200 may then be planarized by, for example, chemical mechanical planarization, to remove the excess metal layer 260 and form the small contacts 252 and gate contacts 254, as depicted in FIG. 25.

Figure 25:
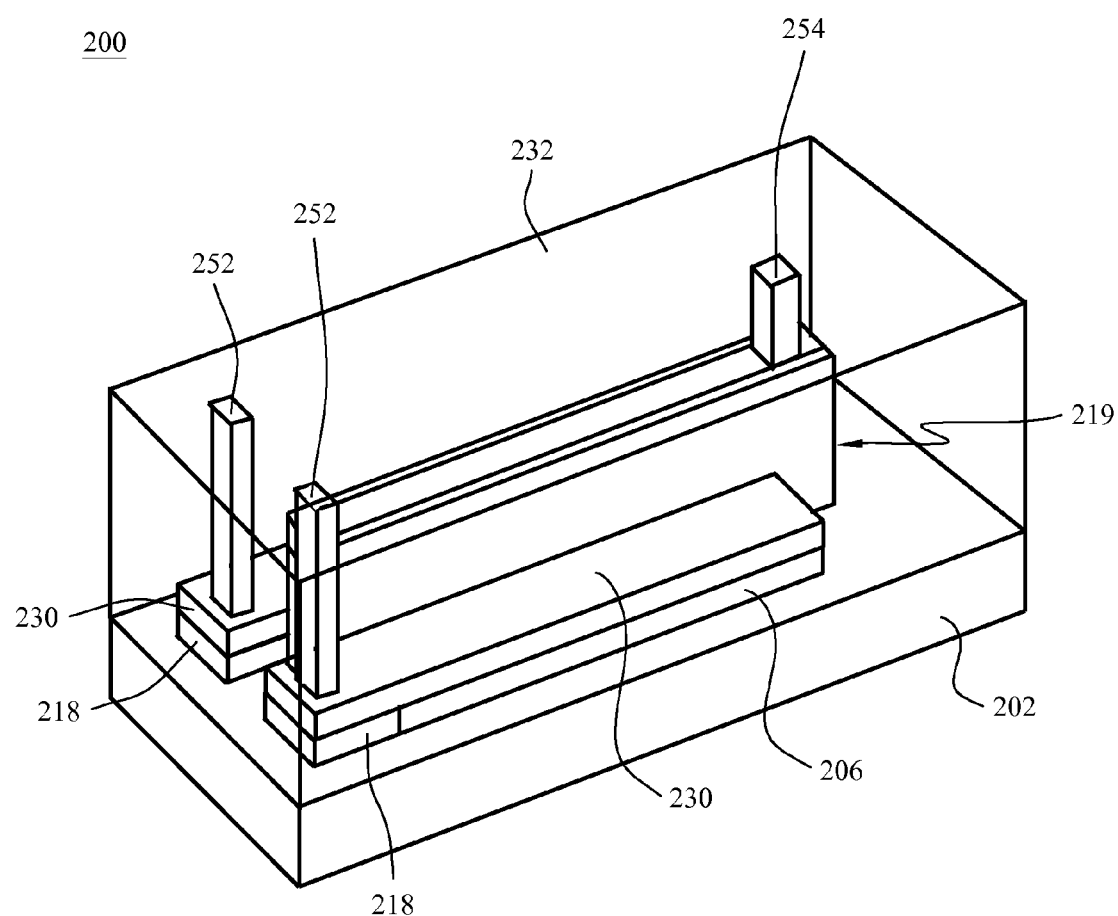
FIG. 25 depicts the structure of FIG. 24 after performing planarization on the device, in accordance with one or more aspects of the present invention.

The contacts 252, as shown in FIG. 25, may be positioned on the contact regions 230 over the at least one source region 204 and at least one drain region 206 and offset from the at least one gate 219. The contacts 252 may be sized and offset from the gate 219 to reduce gate to contact capacitance and gate to contact short failure. As shown, the small contacts 252 may have a width smaller than the width of the contact regions 230 and a height, for example, greater than the height of the at least one gate 219. The small contacts 252 may have height of, for example, approximately 70 nm to 250 nm and, more specifically, approximately 90 nm to 160 nm. Although only one small contact 252 is shown over each of the regions 218, it is contemplated that there may be more than one small contact 252 above each source 204 and drain 206 or the regions 218 adjacent to each source 204 and drain 206. The gate contacts 254, as shown in FIG. 25, may have a height of, for example, approximately 30 nm to 150 nm and, more specifically, approximately 40 nm to 80 nm. Alternatively, the gate contacts 254 may be formed simultaneously with the formation of the contacts 252. After all the contacts 252, 254 are formed, the device 200 is ready for further processing, for example, back end of line processing.

Figure 26:
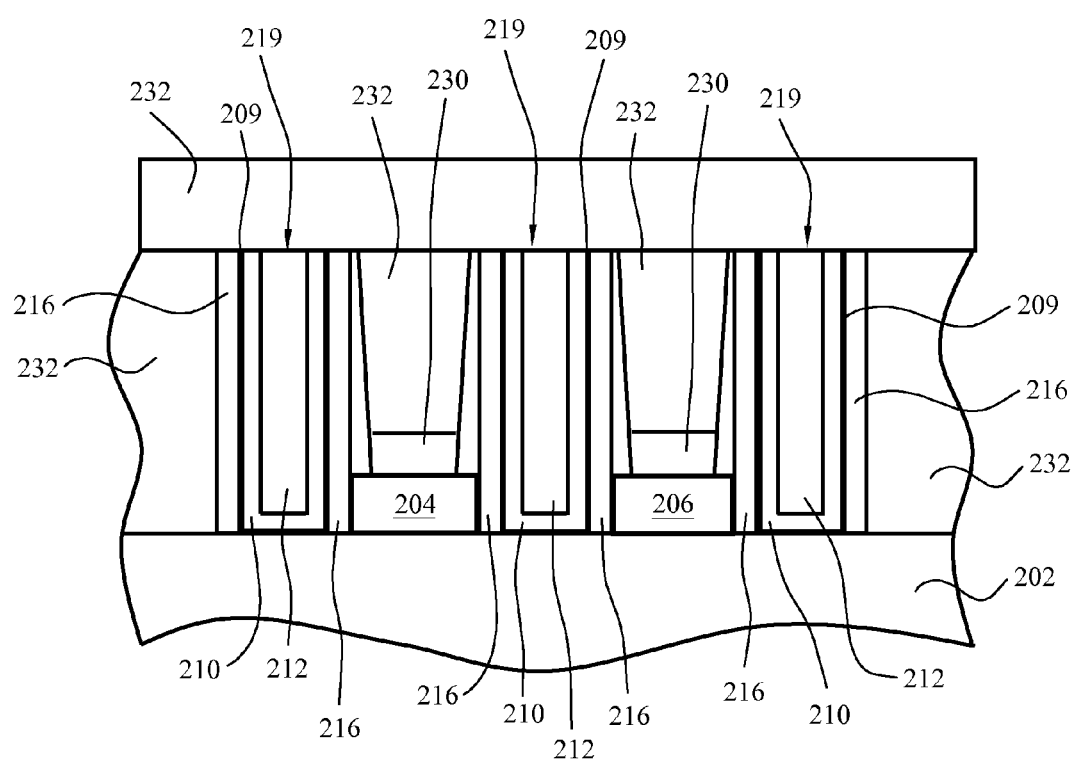
FIG. 26 depicts another embodiment of a portion of a semiconductor device after being processed through the steps of FIGS. 2-15 and after depositing another oxide layer on the device, in accordance with one or more aspects of the present invention.
Figure 27:
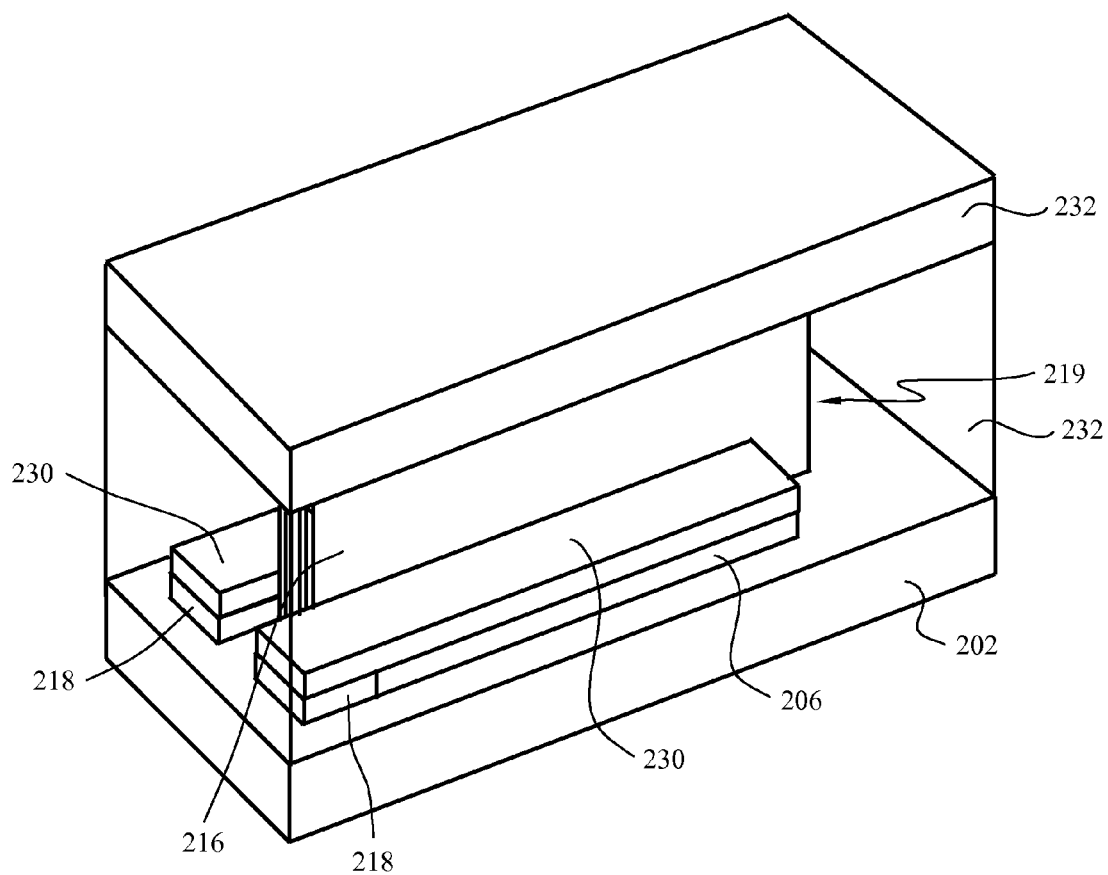
FIG. 27 depicts a perspective view of the structure of FIG. 26, in accordance with one or more aspects of the present invention.

FIGS. 26-33 depict, by way of example only, an alternative embodiment of a portion of the FinFET device formation process of FIG. 1. Note again that these figures are not drawn to scale in order to facilitate understanding of the invention, and that the same reference numerals are used throughout different figures to designate the same or similar elements. The device 280 may have been processed through the fabrication processes described in greater detail above with reference to FIGS. 2-15. Then, an additional oxide layer 232 may be deposited over the device 280, as shown in FIGS. 26 and 27. The device 280 may be planarized after the additional oxide 232 is deposited.

Figure 28:
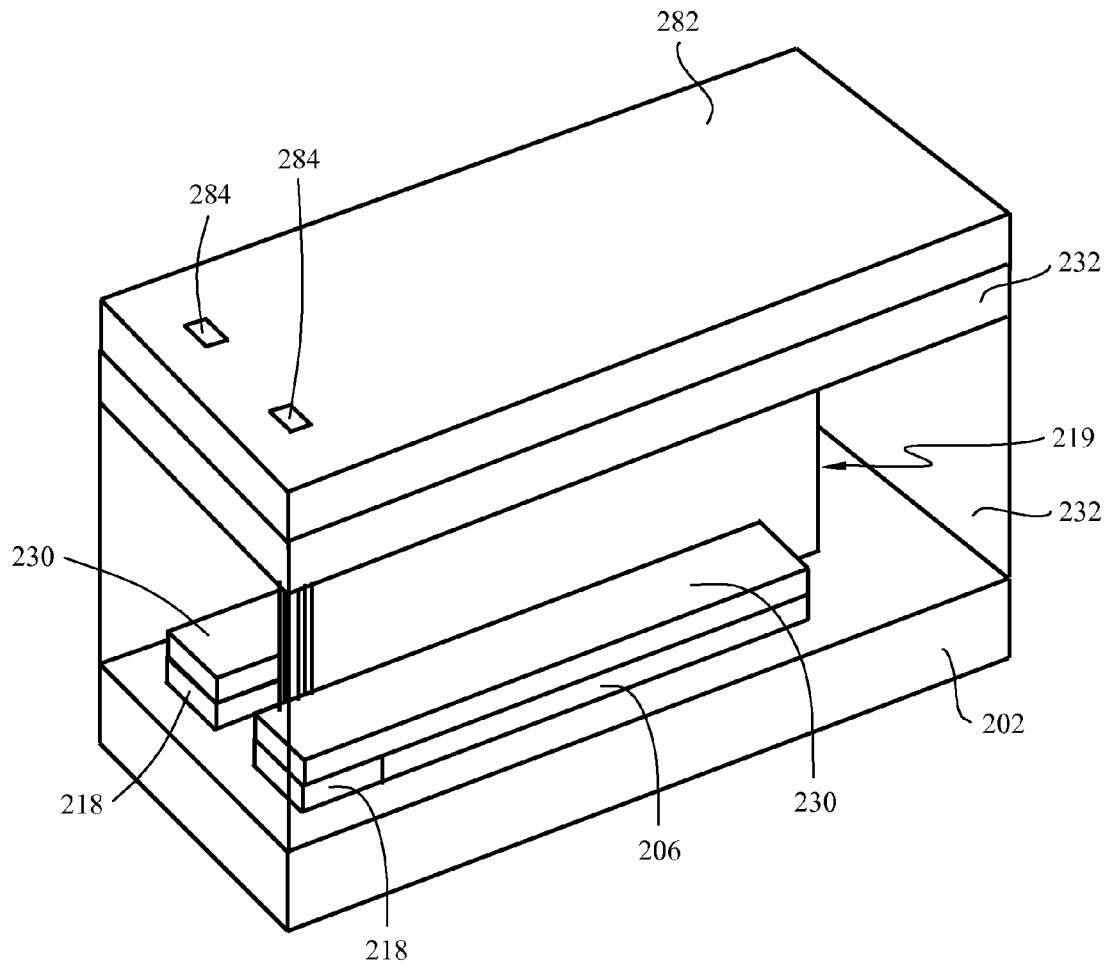
FIG. 28 depicts the structure of FIG. 27 after depositing and patterning a photo resist layer, in accordance with one or more aspects of the present invention.
Figure 29:
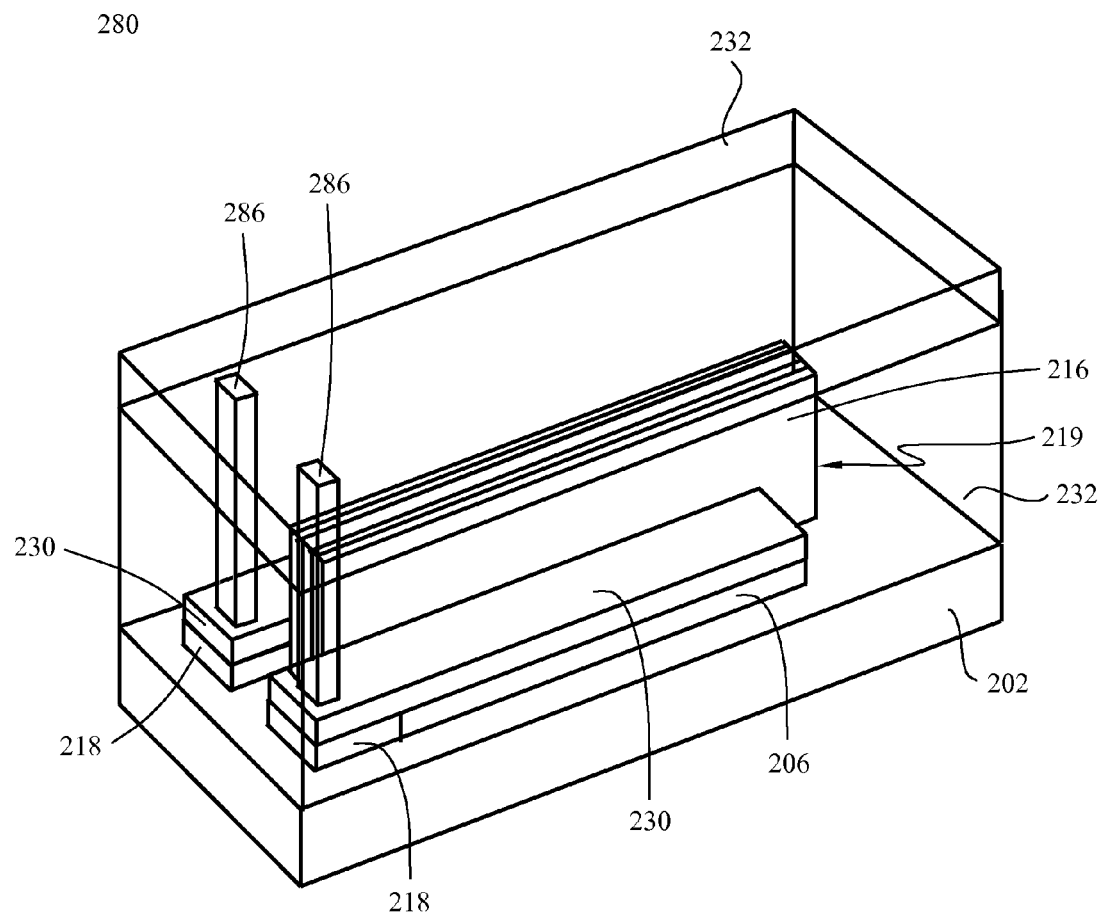
FIG. 29 depicts the structure of FIG. 28 after etching to form the small contact openings, in accordance with one or more aspects of the present invention.
Figure 30:
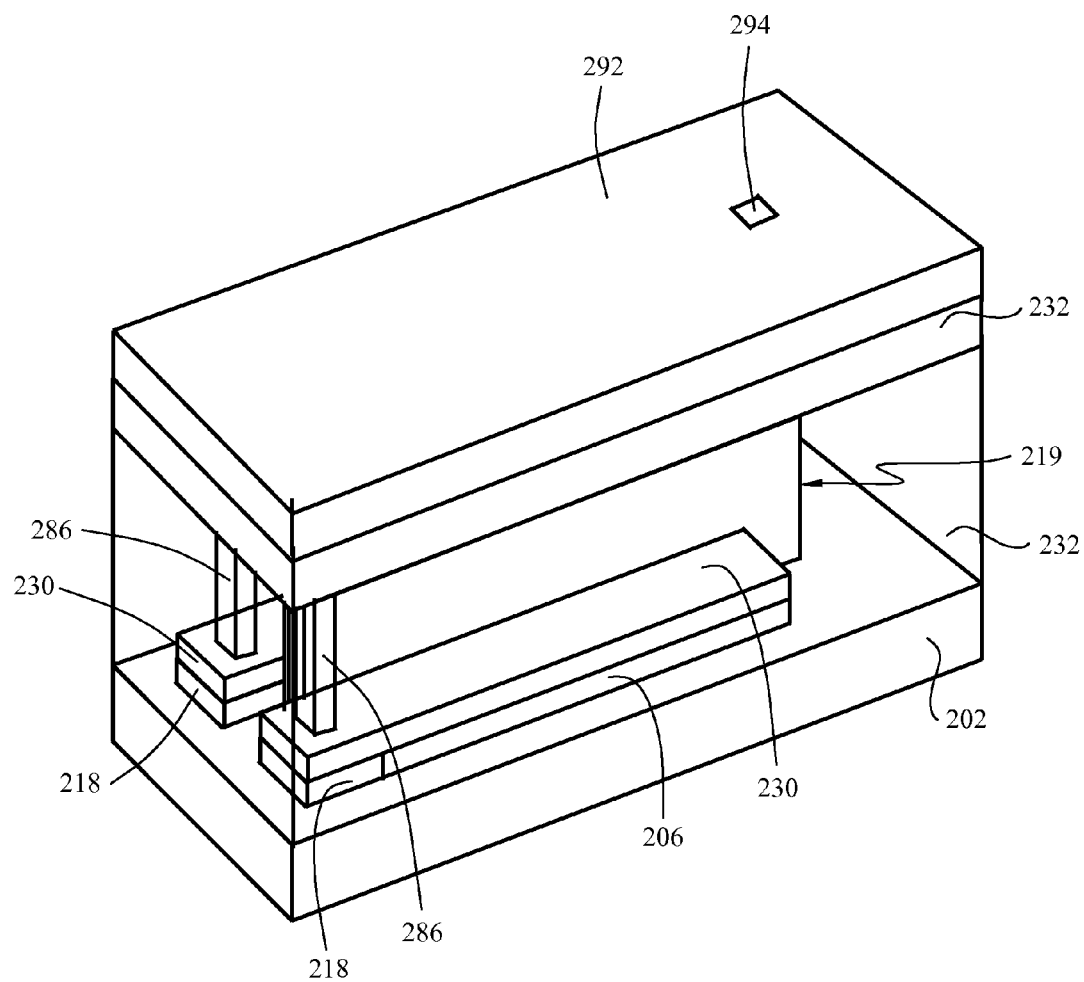
FIG. 30 depicts the structure of FIG. 29 after depositing another photo resist layer and patterning the photo resist layer for forming gate contact openings, in accordance with one or more aspects of the present invention.
Figure 31:
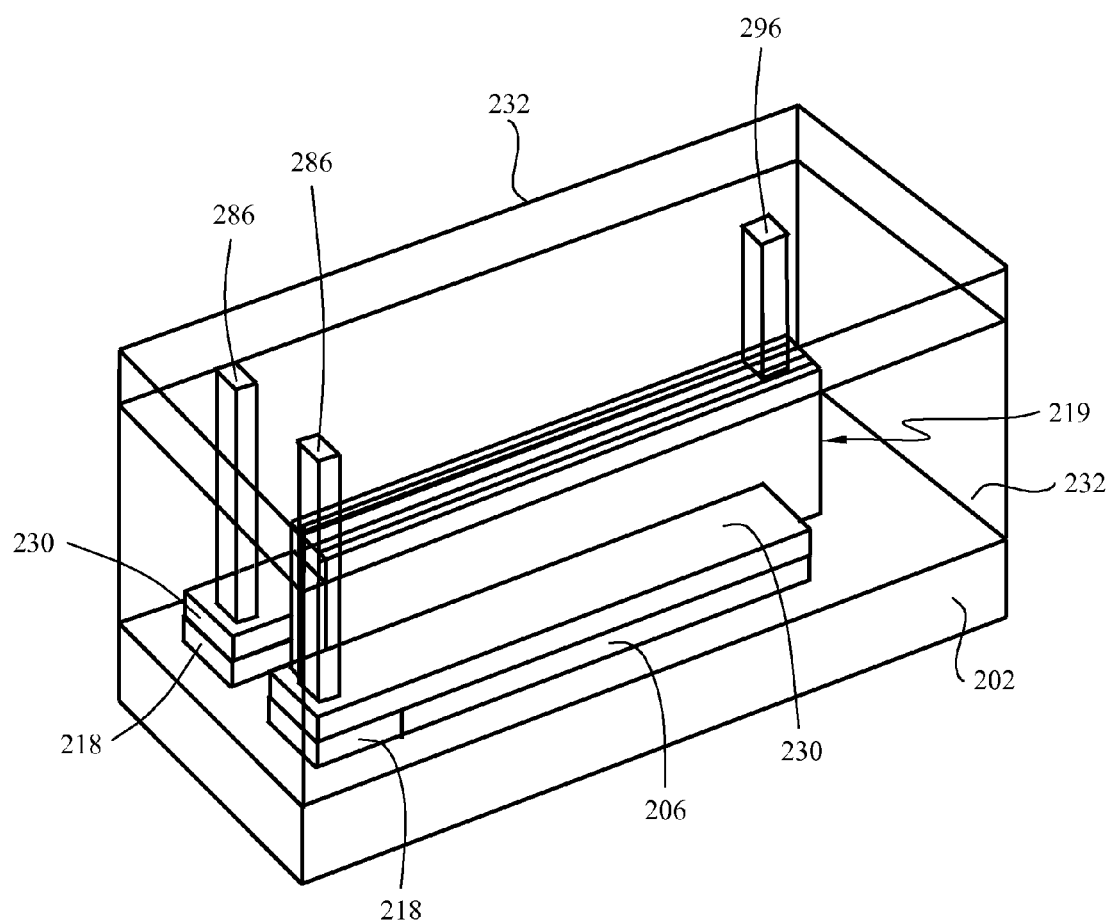
FIG. 31 depicts the structure of FIG. 30 after etching to form the gate contact openings and removing the photo resist layer, in accordance with one or more aspects of the present invention.
Figure 32:
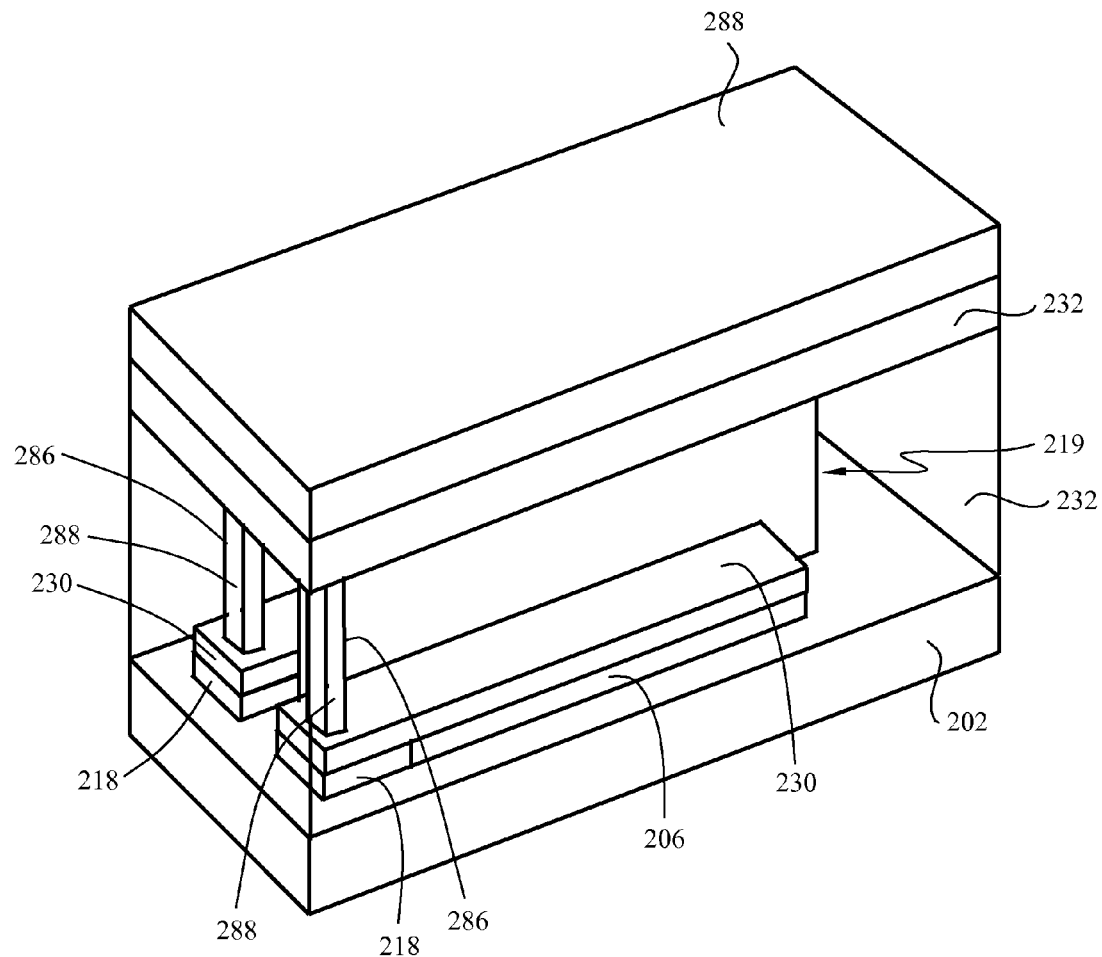
FIG. 32 depicts the structure of FIG. 31 after depositing a metal layer over the device, in accordance with one or more aspects of the present invention.
Figure 33:
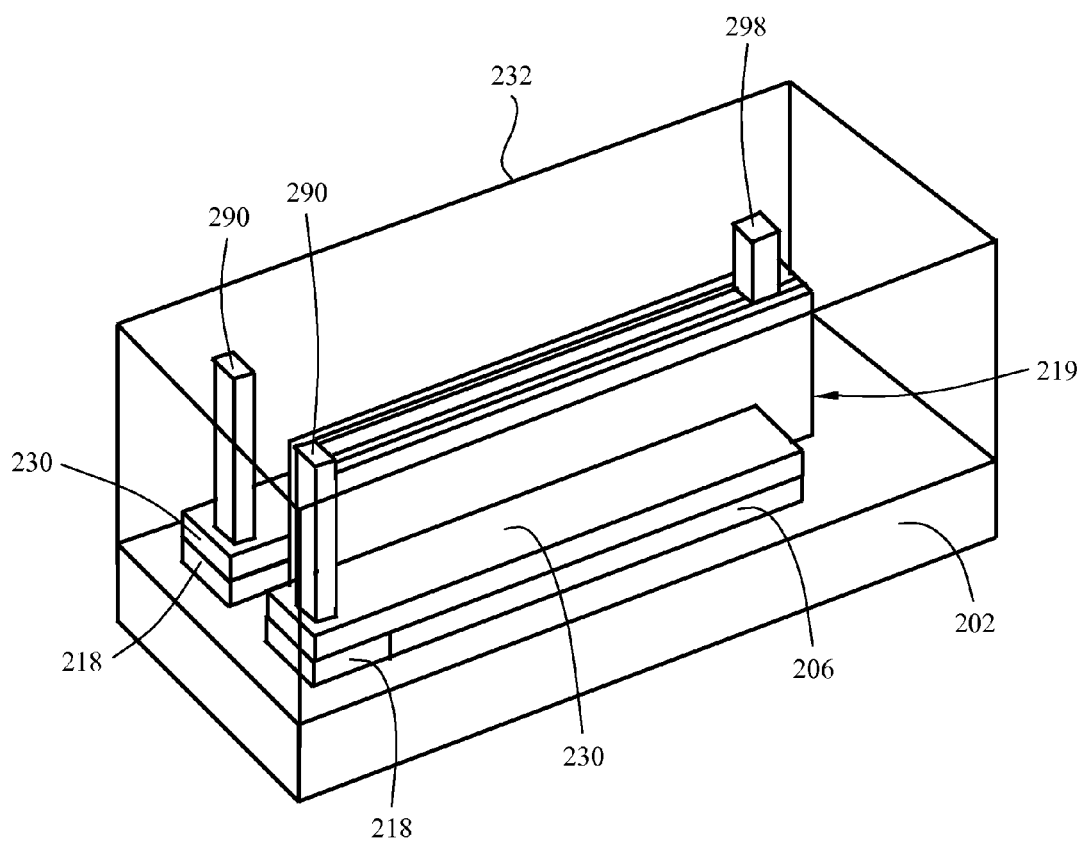
FIG. 33 depicts the structure of FIG. 32 after performing planarization on the device to form the small contacts and gate contacts, in accordance with one or more aspects of the present invention.

Next, as shown in FIG. 28, a photo resist layer 282 may be deposited over the device 280 and lithography may be performed to pattern the photo resist layer 282 to form openings 284. The device 280 may then be etched to extend the openings 284 down to the contact region 230 to form the small contact openings 286 and the photo resist layer 282 may then be removed, as shown in FIG. 29. As shown in FIG. 30, another photo resist layer 292 may be applied over the device 280 and lithography may be performed to pattern the photo resist layer 292 to form openings 294. The photo resist layer 292 may be, for example, a multi-layer photo resist layer, such as, the three layer photo resist as described in greater detail above with reference to photo resist layer 256 and which will not be described again here for brevity sake. Next, as shown in FIG. 31, the device 280 may be etched to extend the openings 294 into the oxide layer 232 to form gate contact openings 296 and the photo resist layer 292 may be removed. Once the gate contact openings 296 are formed, a metal layer 288 may be deposited over the device 280 filling the openings 286, 296. Then, the device 280 may then be planarized by, for example, chemical mechanical planarization, to remove the excess metal from the second metal layer 288 and to form the small contacts 290 and at least one gate contact 298, as shown in FIG. 33.

The small contacts 290 may be positioned, for example, next to or adjacent to the at least one gate 219. As shown, the small contacts 290 may have a width, for example, smaller than the width of the contact regions 230. Although it is also contemplated that the small contacts 290 could have a width, for example, equal to the width of the contact regions 230. The small contacts 290 may have a height of, for example, approximately 70 nm to 250 nm and, more specifically, approximately 90 nm to 160 nm. The small contacts 290 may be sized and positioned to reduce gate to contact capacitance and gate to contact short failure. The gate contact 298 may have a height of, for example, approximately 30 nm to 150 nm and, more specifically, approximately 40 nm to 80 nm. Optionally, the gate contacts 298 may be formed simultaneously with the formation of the small contacts 290. Once the contacts 290, 298 are formed, the device 280 may be passed for further processing, for example, back end of line processing.

Figure 34:
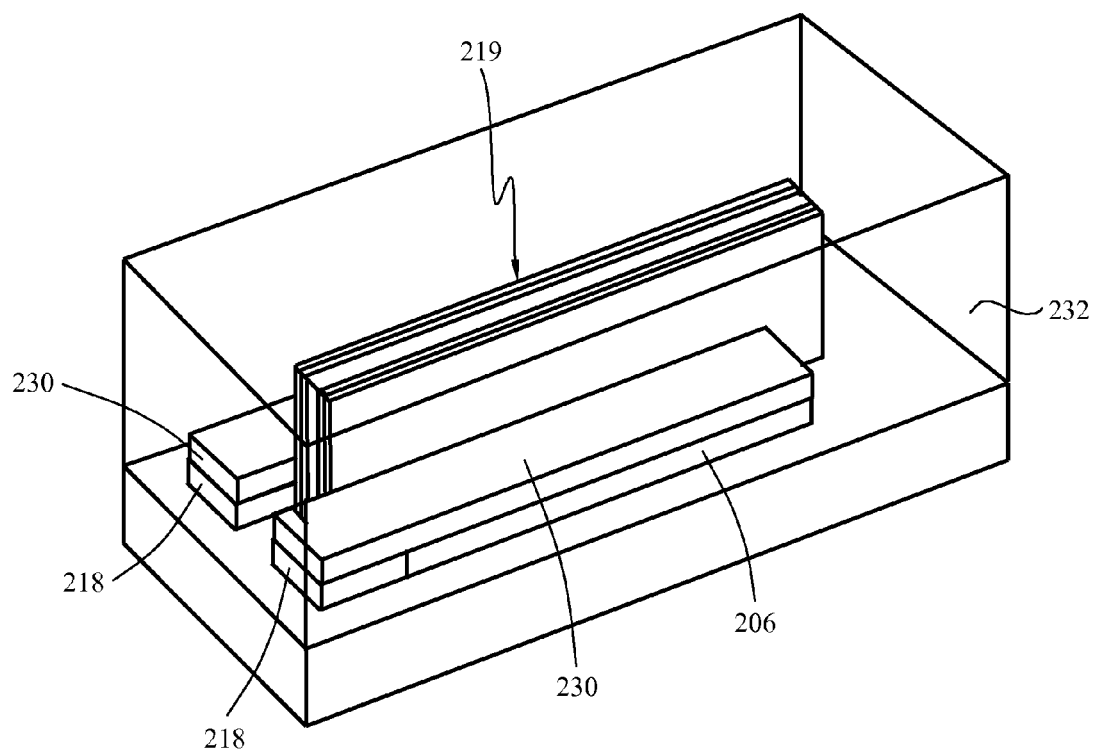
FIG. 34 depicts a perspective view of another embodiment of a portion of a semiconductor device after being processed through the steps of FIGS. 2-15, in accordance with one or more aspects of the present invention.
Figure 35:
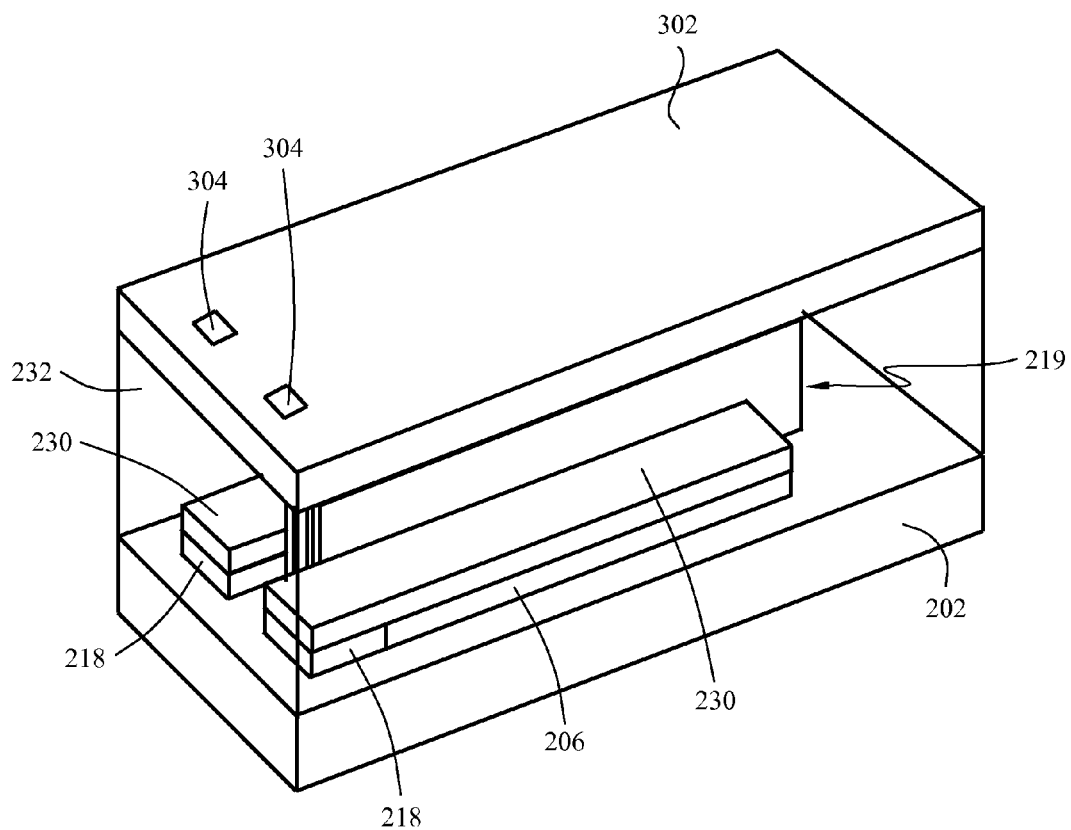
FIG. 35 depicts the structure of FIG. 34 after depositing and patterning a photo resist layer, in accordance with one or more aspects of the present invention.
Figure 36:
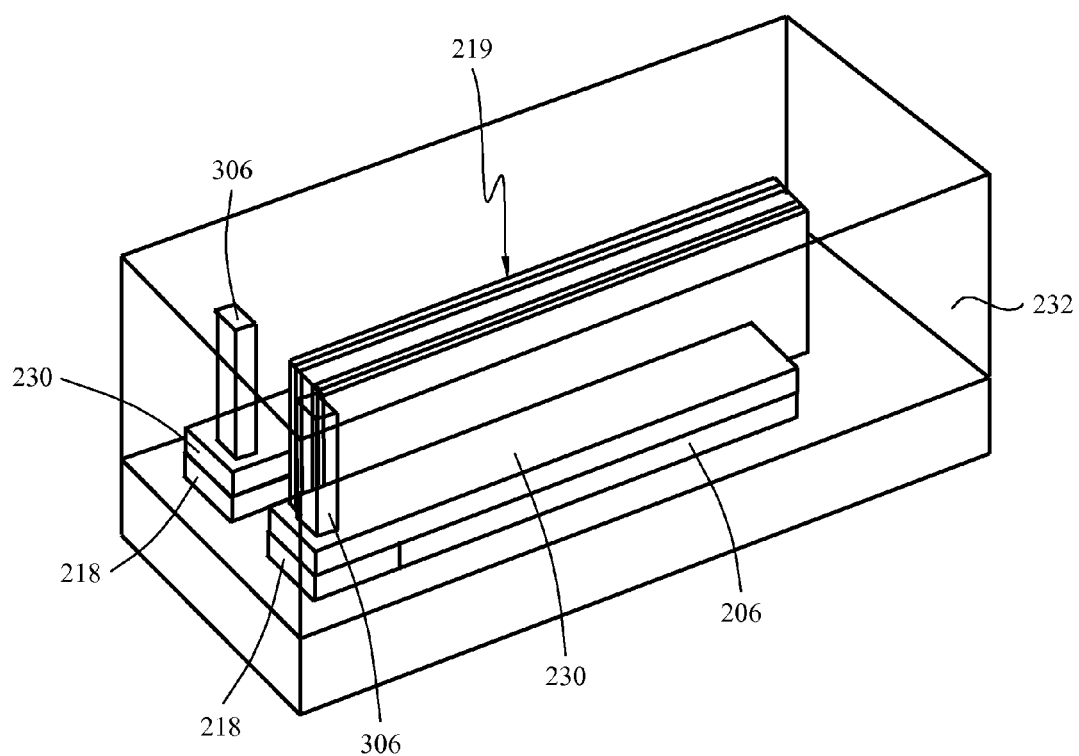
FIG. 36 depicts the structure of FIG. 35 after etching to form a first portion of the small contact openings and removing the photo resist layer, in accordance with one or more aspects of the present invention.
Figure 37:
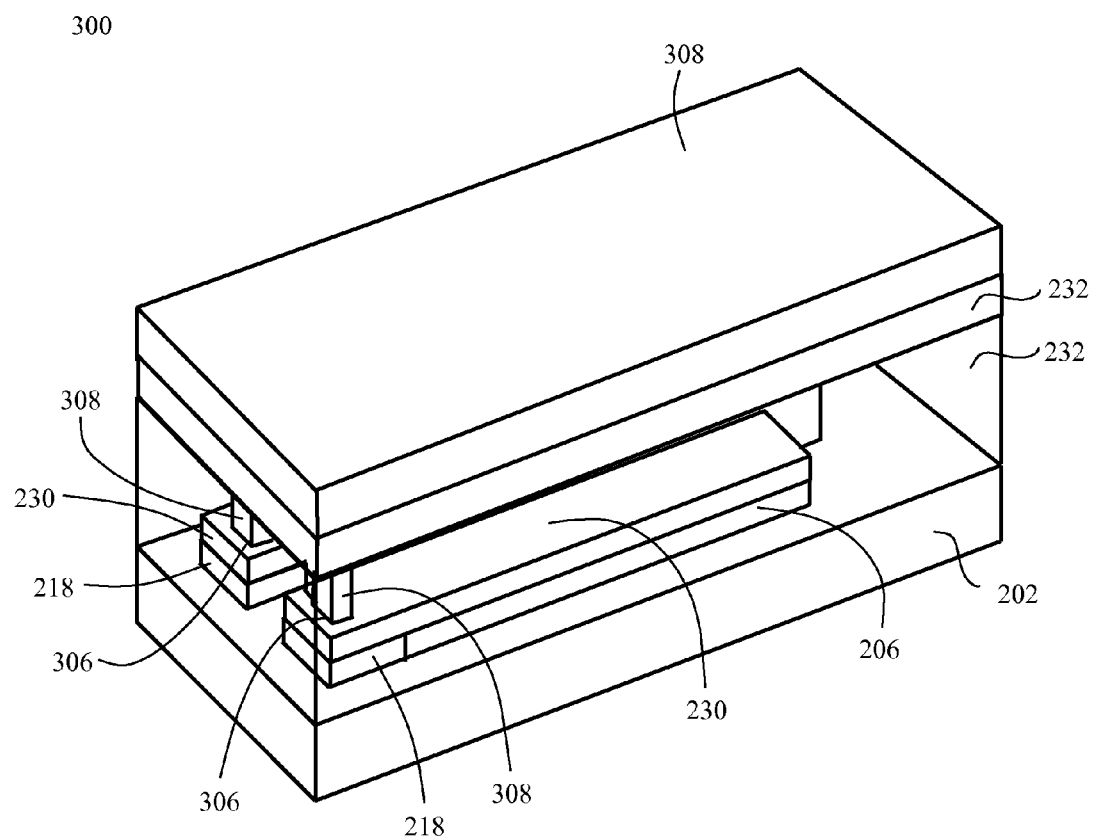
FIG. 37 depicts the structure of FIG. 36 after depositing a first metal layer to form the first portion of the small contacts, in accordance with one or more aspects of the present invention.
Figure 38:
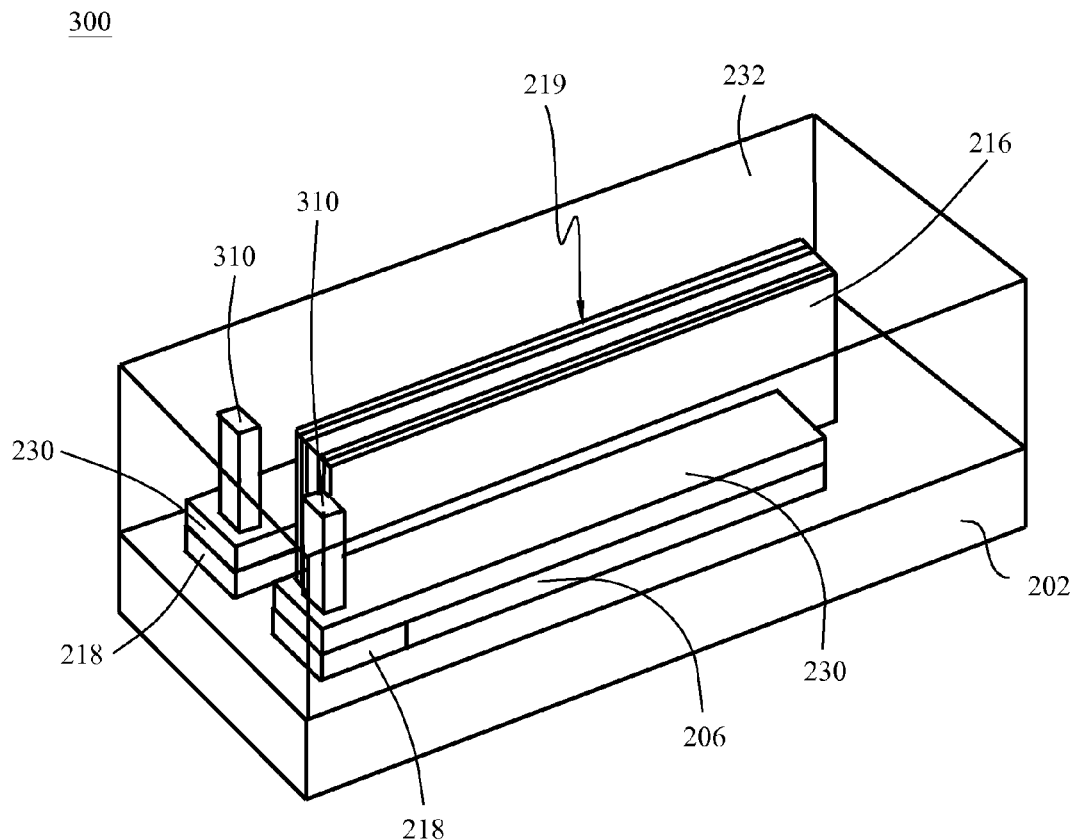
FIG. 38 depicts the structure of FIG. 37 after performing planarization on the device, in accordance with one or more aspects of the present invention.

As described in greater detail above, the device 300 may have been processed through the steps shown in FIGS. 2-15 and is shown in FIG. 34. A photo resist layer 302 may be applied over the device 300 and lithography may then be performed to pattern openings 304 in the photo resist layer 302, as shown in FIG. 35. Next, as shown in FIG. 36, etching may be performed to extend the openings 304 into the oxide layer 232 to form a first portion of the small contact openings 306 and the photo resist layer 302 may be removed. A metal layer 308 may then be deposited over the device 300 filling the contact openings 306, as shown in FIG. 37. The device 300 may then be planarized by, for example, chemical mechanical planarization, to remove the excess metal from the metal layer 308 forming the first portion 310 of the small contacts, as shown in FIG. 38.

Figure 39:
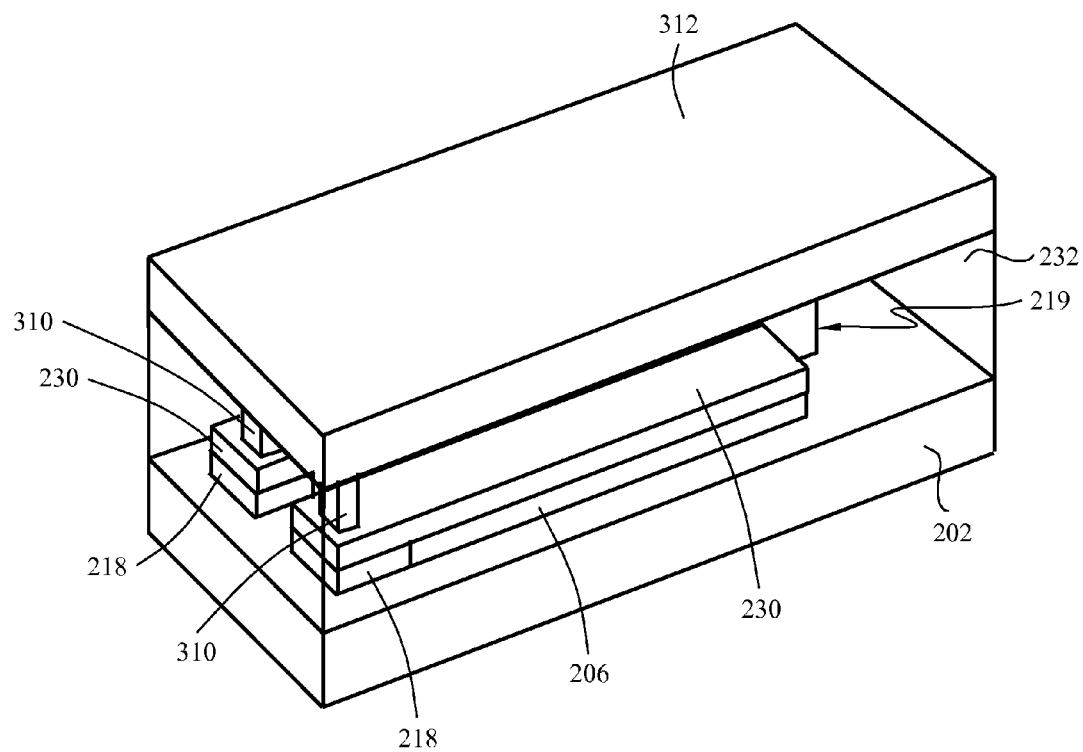
FIG. 39 depicts the structure of FIG. 38 after depositing a low-k material on the device, in accordance with one or more aspects of the present invention.
Figure 40:
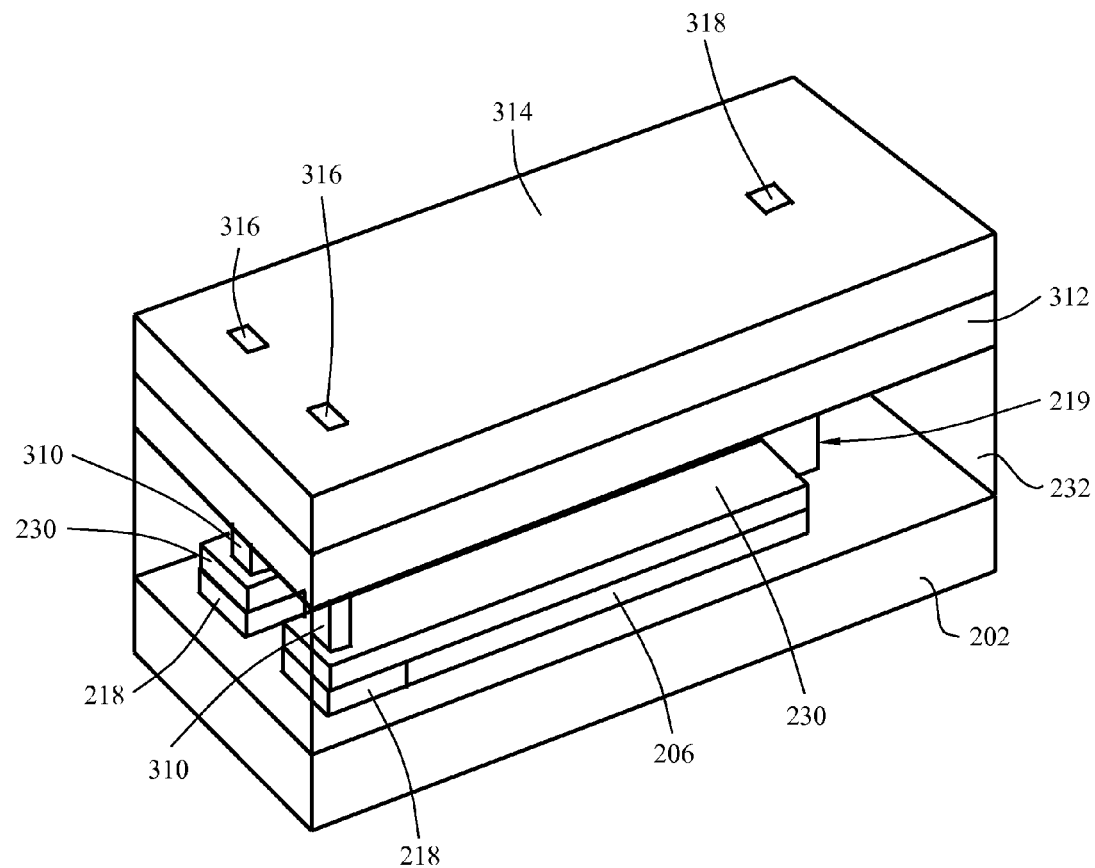
FIG. 40 depicts the structure of FIG. 39 after depositing and patterning a second photo resist layer to form the second portion of the small contact openings and the gate openings, in accordance with one or more aspects of the present invention.
Figure 41:
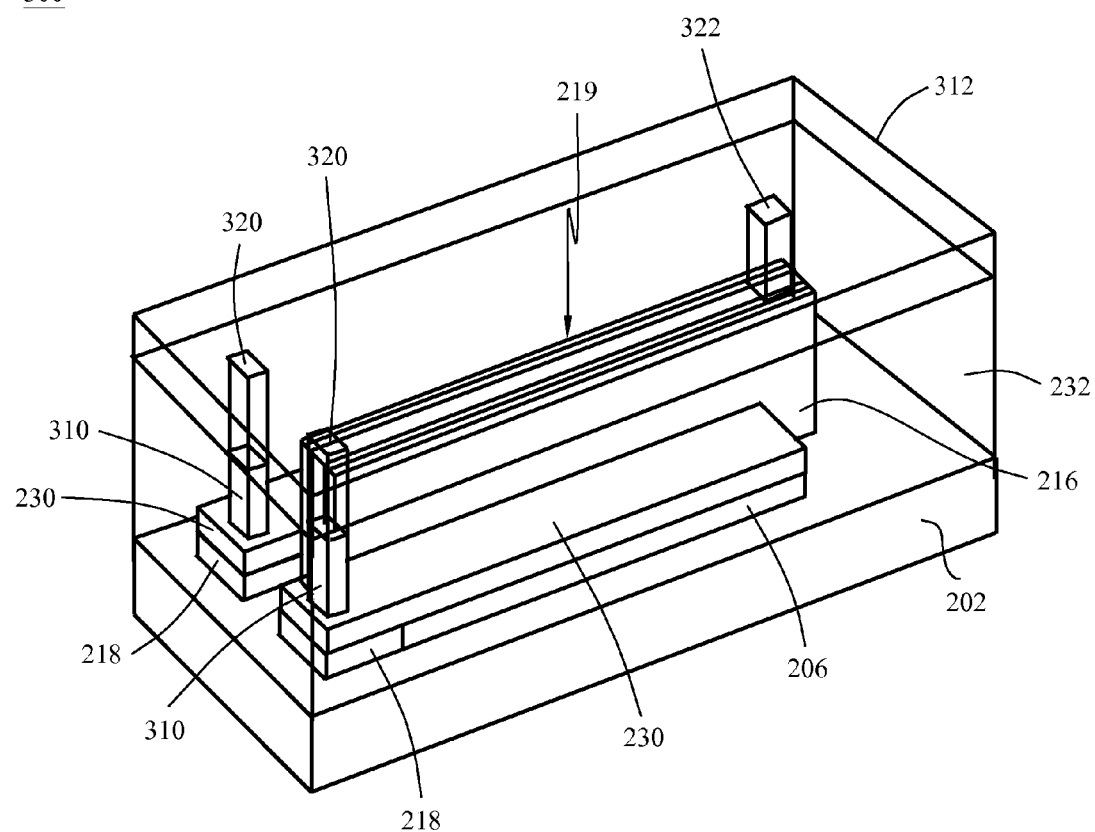
FIG. 41 depicts the structure of FIG. 40 after etching the second portion of the small contact openings and the gate openings and removing the photo resist layer, in accordance with one or more aspects of the present invention.
Figure 42:
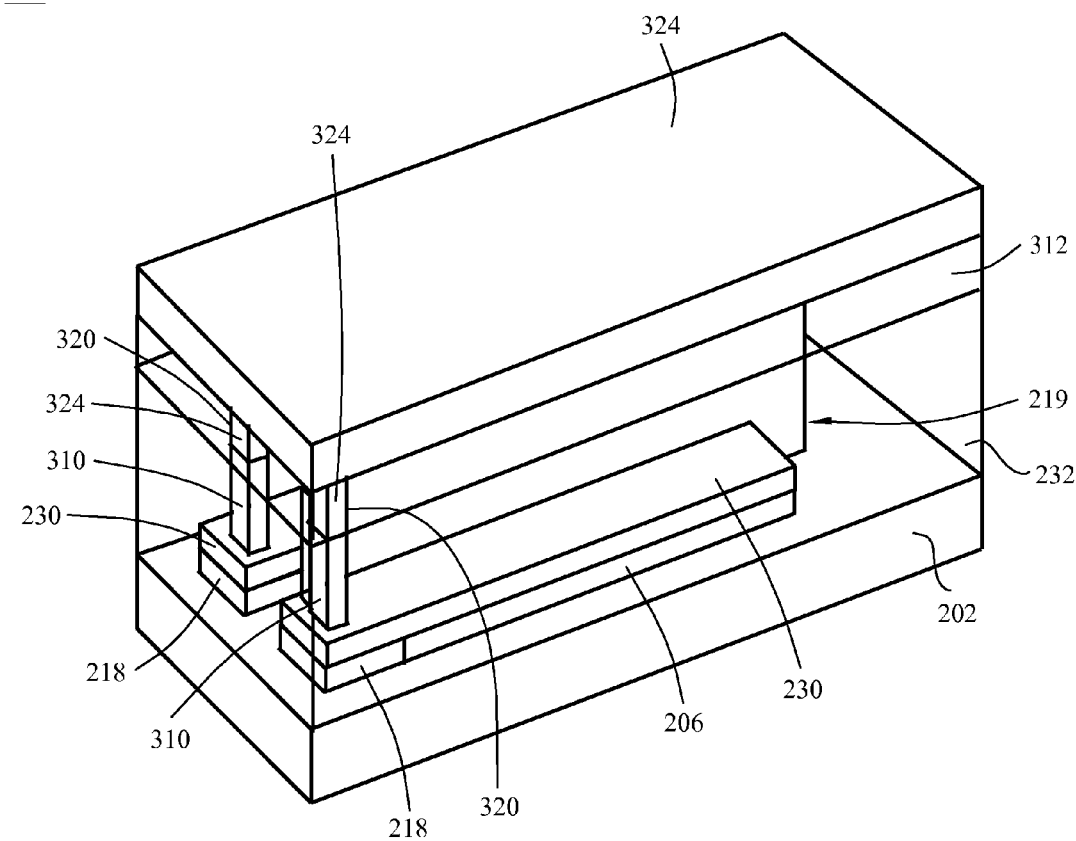
FIG. 42 depicts the structure of FIG. 41 after depositing a metal layer on the device, in accordance with one or more aspects of the present invention.
Figure 43:
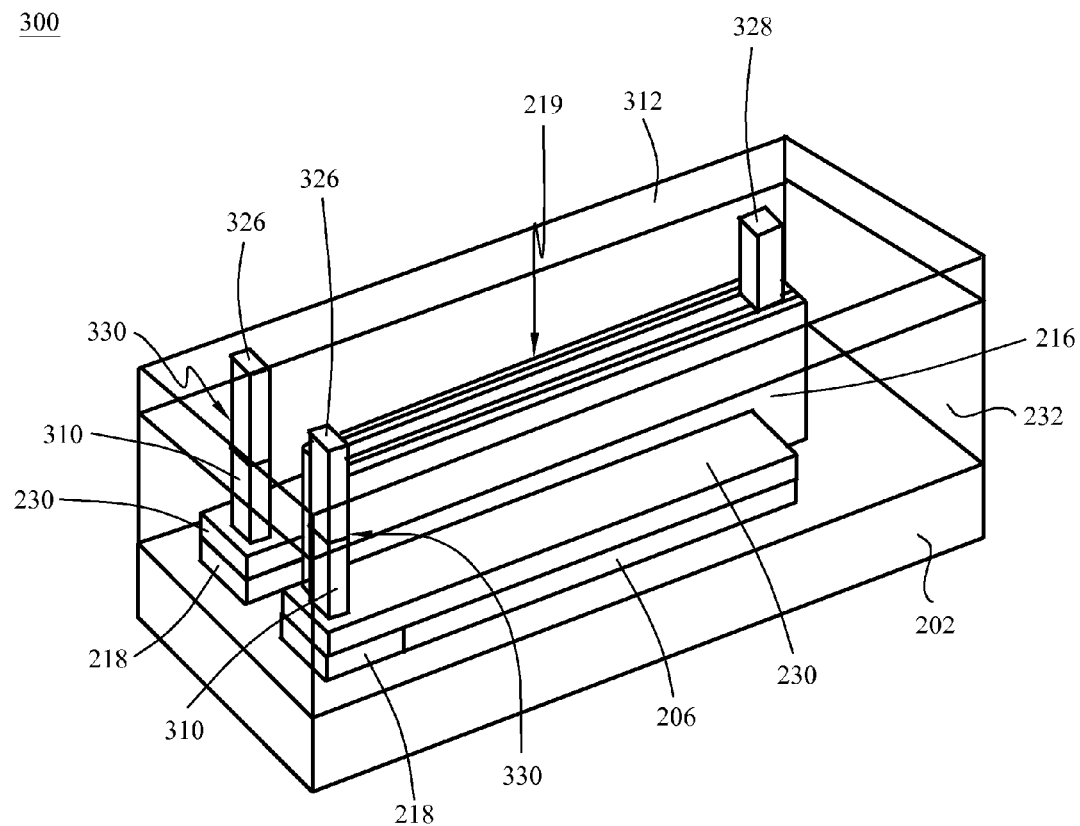
FIG. 43 depicts the structure of FIG. 42 after performing planarization on the device, in accordance with one or more aspects of the present invention.

A low-k dielectric layer 312 may then be deposited over the device 300, as shown in FIG. 39. The low-k material may be, for example, SiCOH. The device 300 may be planarized after the low-k dielectric layer 312 is deposited. It is also contemplated that the low-k dielectric layer 312 may alternatively be, for example, another oxide layer. Next, a photo resist layer 314 may be applied over the low-k dielectric layer 312 and lithography may then be performed to pattern openings 316, 318 into the photo resist layer 314, as shown in FIG. 40. Etching may then be performed to extend the openings 316 into the low-k dielectric layer 312 to form a second portion of the small contact openings 320 and to extend the openings 318 into the low-k dielectric layer 312 to form the gate contact openings 322, as shown in FIG. 41. The photo resist layer 314 may then be removed, as also illustrated in FIG. 41. Another metal layer 324 may then be deposited over the device 300 filling the small contact openings 320 and gate contact openings 322, as shown in FIG. 42. The device 300 may then be planarized by, for example, chemical mechanical planarization, to remove the excess metal from the metal layer 324 forming the second portion 326 of the small contacts and the gate contacts 328, as shown in FIG. 43. In the depicted embodiment of FIG. 43, the small contacts 330 include a first portion 310 and a second portion 326. It is also contemplated that the small contacts 330 may include, for example, more than two portions and each portion may be the same metal or a different metal. The small contacts 330 may be positioned, for example, next to or adjacent to the at least one gate 219.

As shown in FIG. 43, the small contacts 330 may have a width smaller than the width of the contact regions 230. In an alternative embodiment, the small contacts 330 may have, for example, a width equal to the width of the contact regions 230. The small contacts 330 may also have a height, for example, greater than the height of the at least one gate 219. The total height of the small contacts 330 may range from, for example, approximately 70 nm to 250 nm and, more specifically, approximately 90 nm to 160 nm. Thus, by way of specific example, the first portion 310 of the small contacts 330 may have height of, for example, approximately 35 nm to 125 nm and, more specifically, approximately 45 nm to 80 nm, and the second portion 326 of the small contacts 330 may have a height of, for example, approximately 35 nm to 125 nm and, more specifically, approximately 45 nm to 80 nm. The gate contacts 544 may have a height of, for example, approximately 30 nm to 150 nm and, more specifically, approximately 40 nm to 80 nm.

As may be recognized by those of ordinary skill in the art based on the teachings herein, numerous changes and modifications may be made to the above-described and other embodiments of the present invention without departing from the scope of the invention. For example, the small contacts may be positioned offset from or next to the gate, the small contacts may vary in size, and the small contacts may be made of one or more metals, and other components of the device and/or method as disclosed in the specification, including the accompanying abstract and drawings, may be replaced by alternative component(s) or features(s), such as those disclosed in another embodiment, which serve the same, equivalent or similar purpose as known by those skilled in the art to achieve the same, equivalent or similar results by such alternative component(s) or feature(s) to provide a similar function for the intended purpose. In addition, the devices and systems may include more or fewer components or features than the embodiments as described and illustrated herein. For example, the components and features of FIGS. 2-25, FIGS. 26-33, and FIGS. 34-43 may all be used interchangeably and in alternative combinations as would be modified or altered by one of skill in the art. Accordingly, this detailed description of the currently-preferred embodiments is to be taken as illustrative, as opposed to limiting of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    obtaining a wafer with at least one source, at least one drain, and at least one sacrificial gate;
    forming a first contact region over the at least one source and a second contact region over the at least one drain, wherein forming the first and second contact regions comprises:
        performing a first lithography to form openings for the first and second contact regions;
        depositing at least one first metal layer into the openings for the first and second contact regions;
        performing planarization to remove the first metal layer above the first and second contact region openings; and
        etching the first metal layer in the openings to form the first and second contact regions;
    removing the at least one sacrificial gate;
    forming at least one gate; and
    forming at least one first small contact over the first contact region and at least one second small contact over the second contact region.

2. The method of claim 1, wherein forming the at least one first and second small contacts comprises performing a second lithography to form small contact openings.

3. The method of claim 2, further comprising:
    forming at least one gate contact, wherein forming at least one gate contact comprises:
        performing a third lithography to form at least one gate contact opening; and depositing a second metal layer over the wafer to fill the small contact openings and the gate contact openings.

4. The method of claim 3, further comprising:
etching away a portion of the at least one gate before performing the second lithography to form the at least one first and second small contacts; and
forming a self-aligned contact cap over the at least one gate.

5. The method of claim 1, wherein the at least one source and at least one drain are positioned offset from the at least one sacrificial gate, wherein the at least one sacrificial gate has a length and the at least one source and the at least one drain overlap only a portion of the length of the at least one sacrificial gate.

6. The method of claim 1, wherein the at least one source and at least one drain are aligned with the at least one sacrificial gate.

7. The method of claim 1, further comprising:
performing a second lithography to form a first portion of small contact openings; and
depositing a second metal layer over the wafer to fill the first portion of the small contact openings.

8. The method of claim 7, further comprising:
depositing a sacrificial material over the wafer;
performing a third lithography to form a second portion of the small contact openings and gate contact openings;
depositing a third metal layer over the wafer to fill the second portion of the small contact openings and the gate contact openings.

9. The method of claim 8, wherein the first portion comprises a first metal and the second portion comprises a second metal.

10. The method of claim 9, wherein the first small contact and the second small contact are positioned offset from the at least one gate and have a height greater than the height of the at least one gate.

11. The method of claim 9, wherein the first small contact and the second small contact are positioned next to the at least one gate and have a height greater than the height of the at least one gate.

12. The method of claim 8, wherein the sacrificial material is a low-k dielectric material.

13. The method of claim 12, wherein performing the third lithography comprises:
performing a reactive ion etch to form the second portion of the small contact openings and the gate contact openings.

* * * * *